US006639491B2

(12) United States Patent
Toncich

(10) Patent No.: US 6,639,491 B2
(45) Date of Patent: Oct. 28, 2003

(54) TUNABLE FERRO-ELECTRIC MULTIPLEXER

(76) Inventor: Stanley S. Toncich, 11155 Spooner Ct., San Diego, CA (US) 92131

( * ) Notice: Subject to any disclaimer, the term of this patent is extended or adjusted under 35 U.S.C. 154(b) by 46 days.

(21) Appl. No.: 09/912,753

(22) Filed: Jul. 24, 2001

(65) Prior Publication Data

US 2002/0163400 A1 Nov. 7, 2002

Related U.S. Application Data

(60) Provisional application No. 60/283,093, filed on Apr. 11, 2001.

(51) Int. Cl.⁷ .............................. H01P 5/12; H01P 1/215
(52) U.S. Cl. ....................................... 333/125; 128/205
(58) Field of Search ............................... 333/202, 205, 333/235, 995, 701, 125, 128; 505/210, 700

(56) References Cited

U.S. PATENT DOCUMENTS

| | | | |
|---|---|---|---|
| 3,413,543 A | 11/1968 | Schubring et al. | |
| 3,676,803 A | 7/1972 | Simmons | |
| 3,678,305 A | 7/1972 | George | |

(List continued on next page.)

FOREIGN PATENT DOCUMENTS

| | | |
|---|---|---|
| DE | 40 36 866 A1 | 7/1991 |
| EP | 0 637 131 A1 | 2/1995 |
| EP | 0 638 953 A1 | 2/1995 |
| EP | 0 680 108 A1 | 11/1995 |
| EP | 0 795 922 A1 | 9/1997 |
| EP | 0 843 374 A2 | 5/1998 |
| EP | 0 881 700 A1 | 12/1998 |
| EP | 0 909 024 A2 | 4/1999 |
| EP | 1 043 741 A2 | 10/2000 |
| JP | 29-05-00 2001338839 | 7/2001 |
| WO | WO 94/13028 | 6/1994 |
| WO | WO 00/28613 | 5/2000 |
| WO | WO 00/35042 | 6/2000 |
| WO | WO 00/62367 | 10/2000 |
| WO | WO 00/79645 A1 | 12/2000 |
| WO | WO 00/79648 A1 | 12/2000 |

OTHER PUBLICATIONS

A. Presser, "Varactor–Tunable, High–Q Microwave Filter," RCA Review, vol. 42, Dec. 1981, pp. 691–705.
C. Chang and T. Itoh, "Microwave Active Filters Based on Coupled Negative Resistance Method," IEEE Trans. on Microwave Theory and Techniques, vol. 38, No. 12, Dec. 1990, pp. 1879–1884.
P. Katzin, B. Bedard, and Y. Ayasli, "Narrow–Band MMIC Filters with Automatic Tuning and Q–Factor Control," 1993 IEEE MTT–S Int. Microwave Symp. Digest pp. 403–406.
B. Hopf, I. Wolff, and M. Guglielmi, "Coplanar MMIC Active Bandpass Filters Using Negative Resistance Circuits," 1994 IEEE MTT–S Symposium Digest, pp. 1183–1185.
U. Karacaoglu and I.D. Robertson, "High Selectivity Varactor–Tuned MMIC Bandpass Filter Using Lossless Active Resonators," 1994 IEEE MTT–Symposium Digest, pp. 1191–1194.

(List continued on next page.)

*Primary Examiner*—Robert Pascal
*Assistant Examiner*—Dean Takaoka

(57) ABSTRACT

The present invention provides a tunable ferro-electric multiplexer for use in CDMA communication devices. Tunable ferro-electric capacitors are used to tune the resonant frequencies of several resonators used in a multiplexer and to tune the frequency response shape of the multiplexer. A low loss ferro-electric material and configuration is provided. The tunable multiplexer is smaller and has less insertion loss than a fixed tuned multiplexer.

39 Claims, 10 Drawing Sheets

EXAMPLE OPERATING PARAMETERS

Temperature ( degrees C )
  -50 to 100
Quality Factor (Q)
  Example 1: > 80
  Example 2: > 180
  Example 3: > 350
Frequency (GHz)
  Example 1: 0.25 to 7.0
  Example 2: 0.8 to 7.0
  Example 3: 0.25 to 2.5
  Example 4: 0.8 to 2.5

Capacitance (pF)
  Example 1: 0.3 to 3.0
  Example 2: 0.5 to 1.0
Resonator (technology)
  Example 1: Stripline
  Example 2: Monoblock
  Example 3: Coaxial
  Example 4: Volumetric

U.S. PATENT DOCUMENTS

| | | | |
|---|---|---|---|
| 3,836,874 | A | 9/1974 | Maeda et al. |
| 3,918,012 | A | 11/1975 | Peuzin |
| 4,475,108 | A | 10/1984 | Moser |
| 4,733,328 | A | 3/1988 | Blazej |
| 4,799,066 | A | 1/1989 | Deacon |
| 4,835,499 | A | 5/1989 | Pickett |
| 5,166,857 | A | 11/1992 | Avanic et al. |
| 5,212,463 | A | 5/1993 | Babbitt et al. |
| 5,216,392 | A | 6/1993 | Fraser |
| 5,307,033 | A | 4/1994 | Koscica et al. |
| 5,427,988 | A | 6/1995 | Sengupta et al. |
| 5,450,092 | A | 9/1995 | Das |
| 5,472,935 | A | 12/1995 | Yandrofski et al. |
| 5,496,795 | A | 3/1996 | Das |
| 5,557,286 | A | 9/1996 | Varadan et al. |
| 5,561,407 | A | 10/1996 | Koscica et al. |
| 5,589,845 | A | 12/1996 | Yandrofski et al. |
| 5,617,104 | A | 4/1997 | Das |
| 5,640,042 | A | 6/1997 | Koscica et al. |
| 5,729,239 | A | 3/1998 | Rao |
| 5,777,524 | A | 7/1998 | Wojewoda et al. |
| 5,778,308 | A | 7/1998 | Sroka et al. |
| 5,880,921 | A | 3/1999 | Tham et al. |
| 5,908,811 | A * | 6/1999 | Das .......................... 505/210 |
| 5,945,887 | A | 8/1999 | Makino et al. |
| 5,973,567 | A | 10/1999 | Heal et al. |
| 5,973,568 | A | 10/1999 | Shapiro et al. |
| 5,987,314 | A | 11/1999 | Saito |
| 6,018,282 | A * | 1/2000 | Tsuda ......................... 333/205 |
| 6,028,561 | A | 2/2000 | Takei |
| 6,049,726 | A | 4/2000 | Gruenwald et al. |
| 6,052,036 | A | 4/2000 | Enstrom et al. |
| 6,094,588 | A * | 7/2000 | Adam ......................... 505/210 |
| 6,097,263 | A | 8/2000 | Mueller et al. |
| 6,108,191 | A * | 8/2000 | Bruchhaus et al. ....... 361/306.3 |
| 6,160,524 | A | 12/2000 | Wilber |
| 6,198,441 | B1 | 3/2001 | Okabe |
| 6,292,143 | B1 | 9/2001 | Romanofsky |
| 6,333,719 | B1 | 12/2001 | Varadan |

OTHER PUBLICATIONS

B. Nauta, "A CMOS Transconductance–C Filter Technique for Very High Frequencies," IEEE Journal of Solid–State Circuits, vol. 27, No. 2, Feb. 1992, pp. 142–153.

K Fujita, H. Itoh, R. Yamamoto, "A 15.6 GHz Commercially Based 1/8 GaAs Dynnamic Presealer," 1989 IEEE GaAs IC Symposium, pp. 113–116.

J. Smuk, P. Katzin, "MMIC Phase Locked L–S Band Oscillators," 1994 IEEE GaAs Symposium Digest, pp. 27–29.

S. R. Chandler, I . C. Hunter, amd J. G. Gardiner, "Active Varactor Tunable Bandpass Filters,"IEEE Microwave and Guided Wave Letters, vol. 3, No. 3, Mar. 1993, pp. 70–71.

I. C. Hunter and John D. Rhodes, "Electronically Tunable Microwave Bandpass Filters," IEEE Trans. on MTT, vol. 30, No. 9, Sep. 1982, pp. 1354–1367.

S. Toyoda, "Quarter–wavelength Coupled Variable Bandstop and Bandpass Filters Using Varactor Diodes," IEEE Trans. on Mtt, vol. 30, No. 9, Sep. 1982, pp. 1387–1389.

B. Yu. Kapilevich, "Variety of Approaches to Designing Microwave Active Filters," Proc. 27th European Microwave Conf., Jerusalem, vol. 1, 1997, pp. 397–408.

B. Yu. Kapilevich, "Understand the Operation of Channelized Active Filters," Microwaves & RF, Jan. 1997, pp. 89–92.

M. Dishal, "Alignement and Adjustment of Synchronously Tuned Multiple Resonator–Circuit Filters" Proc. IRE 39, Nov. 1951, pp. 1448–1455.

S. B. Cohn, "Dissipation Loss in Multiple–Coupled–Resonator Filters," Proc. IRE 47, Aug. 1959, pp. 1342–1348.

G. L. Matthaei, "An Electronically Tunable Up–Converter," Proc. IRE 49, Nov. 1961, pp. 1703–1704.

E. G. Fubini and E.A. Guillemin, "Minimum Insertion Loss Filters," Proc. IRE 47, Jan. 1959, pp. 37–41.

W.J. Getsinger, "Protypes for Use in Broadbanding Reflection Amplifiers," IEEE Trans. PTGMTT–11, Nov. 1963, pp. 486–497.

E.S. Kuh and M. Fukada, "Optimum Sunthesis of Wide–Band Parametric Amplifiers and Converters," IRE Trans. PCCT–8, Dec. 1961, pp. 410–415.

W. J. Getsinger and G.L. Matthaei, "Some Aspects of the Design of Wide–Band Up–Converters and Nondegenerate Parametric Amplifiers," IEEE Trans. PTGMTT–12, Jan. 1964, pp. 77–87.

R. L. Sleven, "Design of a Tunable Multi–Cavity Waveguide Band–Pass Filter," 1959 IRE National Convention Record, Part 3, pp. 91–112.

J.J. Taub and B. F. Bogner, "Design of Three–Resonator Dissipative Band–Pass Filters Having Minimum Insertion Loss", Proc. IRE 45, pp. 681–687 (May 1957).

K.L. Kotzebue, "Broadband Electronically–Tunable Microwave Filters," 1960 IRE Wescon Convention Record, Part 1, pp.21–27.

J.P. Louhos and I. Pankinaho, "Electrical Tuning of Integrated Mobile Phone Antennas," Nokia Mobile Phones, pp. 69–97 (Sep. 15, 1999).

P. K. Panayi, M. Al–Nuaimi and L. P. Ivrissimtzis, "Tuning Techniques for the Planar Inverted–F Antenna," National Conference on Antennas and Propagation Publication, No. 461, pp. 259–262 (Apr. 1999).

Satoshi Makioka, et al., "A High Efficiency GaAs MCM Power Amplifier for 1.9 GHz Digital Cordless Telephones, "IEEE 1994 Microwave and Millimeter–Wave Monolithic Circuits Symposium, pp. 51–54 (1994).

V. K. Varadan, K. A. Jose, V. V. Vadan, "Design and Development of Electronically Tunable Microstrip Antennas," IOP Publishing Ltd., pp.238–242 (1999).

Communication Relating to the Results of the Partial International Search: PCT/IB 02/01077 (2002).

International Search Report: PCT/IB 02/01086 (Jun. 24, 2002).

International Search Report: PCT/IB 02/01078 (Jul. 10, 2002).

International Search Report: PCT/IB 02/01087 (Jul. 19, 2002).

International Search Report: PCT/IB 02/01107 (Jul. 11, 2002).

International Search Report: PCT/IB 02/IB 02/01120 (Jul. 11, 2002).

International Search Report: PCT/IB 02/01098 (Jul. 4, 2002).

International Search Report: PCT/IB 02/01082 (Jul. 8, 2002).

International Search Report: PCT/IB 02/01144 (Jul. 12, 2002).

International Search Report: PCT/IB 02/01026 (Jun. 28, 2002).

International Search Report: PCT/IB 02/01027 (Jun. 25, 2002).

* cited by examiner

EXAMPLE OPERATING PARAMETERS

| | |
|---|---|
| Temperature ( degrees C ) <br>   -50 to 100 <br> Quality Factor (Q) <br>   Example 1: > 80 <br>   Example 2: > 180 <br>   Example 3: > 350 <br> Frequency (GHz) <br>   Example 1: 0.25 to 7.0 <br>   Example 2: 0.8 to 7.0 <br>   Example 3: 0.25 to 2.5 <br>   Example 4: 0.8 to 2.5 | Capacitance (pF) <br>   Example 1: 0.3 to 3.0 <br>   Example 2: 0.5 to 1.0 <br> Resonator (technology) <br>   Example 1: Stripline <br>   Example 2: Monoblock <br>   Example 3: Coaxial <br>   Example 4: Volumetric |

| DB [S31]-1850 | 1910 | DB [S32]-1930 | 1990 | DB [S12]-1880 | 1910 | 1990 | 1990 |
|---|---|---|---|---|---|---|---|
| -3.66931 | -36.7437 | -45.3034 | -48.9162 | -62.8514 | -58.8574 | -87.8768 | -87.8768 |
| -45.4237 | -17.8015 | -3.44275 | -33.089 | 0 | 0 | 0 | 0 |

| DB [S31]-1850 | 1910 | DB [S32]-1930 | 1990 | DB [S12]-1880 | 1910 | 1990 | 1990 |
|---|---|---|---|---|---|---|---|
| -3.03487 | -36.6905 | -45.3917 | -48.9062 | -62.7783 | -58.7022 | -87.8551 | -87.8551 |
| -45.5968 | -17.155 | -2.8109 | -33.0429 | 0 | 0 | 0 | 0 |

TUNABLE FERRO-ELECTRIC MULTIPLEXER

RELATED APPLICATION

This application claims the benefit of U.S. Provisional Application No. 60/283,093, filed Apr. 11, 2001, which is hereby incorporated by reference. In addition, this application relates to U.S. application Ser. No. 09/904,631 "Tunable Ferro-electric Filter," filed on Jul. 13, 2001, which is hereby incorporated by reference.

BACKGROUND

Description of Related Art

Filters, such as bandpass filters, have numerous applications in communications and electronics. For example, in wireless communications a given frequency band must accommodate many wireless users. To accommodate so many users, stringent bandpass filtering requirements must be achieved because of the crowded frequency allocations provided.

At present, wireless handsets use fixed-tuned bandpass filters (BPFs) to meet their filtering specifications. The design of such filters is complicated because they must achieve the lowest possible passband insertion loss (I.L.) while simultaneously achieving a specified large out-of-band rejection. As a specific example, consider full band PCS CDMA handsets using fixed bandwidth filters. The PCS transmit (TX) band should have no more than −3.5 dB I.L. in-band (1850 to 1910 MHz in the U.S.) while having at least a 38.0 dB out-of-band rejection in the receive (RX) band (1930 to 1990 MHz range).

Further, this BPF must meet these specifications with a maximum constraint on height. A typical height constraint in present day handsets, for example, is 4.0 mm or less. To meet these demanding electrical requirements yet possess the smallest possible size and height, high order (>$2^{nd}$ order) fixed-tuned filters constructed from either individual coaxial resonator elements or monoblock structures are usually necessary. In addition, to satisfy out-of-band rejection specifications, a transmission zero is usually required, increasing I.L. at the band edge. Because of variations in ceramics and fabrication tolerances, vendors must individually adjust the characteristics of fixed-tuned filters during their manufacture, driving costs higher.

Moreover, if more than one frequency band were to be supported (e.g., supporting the PCS bands in the U.S., Korea, and India) multiple fixed-tuned BPFs would be necessary, requiring extra switches which introduces additional loss. This is true, even if the power amplifier and low noise amplifier used have sufficient bandwidth to operate over these multiple bands.

A tunable BPF would allow the use of one BPF over several bands, or of a lower order filter to cover a bandwidth wider than a required passband at any particular time. To provide the tunability in a tunable BPF, a component capable of providing a variable capacitance is typically used.

Several structures are presently used to implement a variable capacitor. For example, movable parallel plates have been used for many years as the tuner in home radios. However, such plates are far too bulky, noisy, and impractical for use in most modern applications.

Another alternative, the electronic varactor, is a semiconductor device that adjusts capacitance responsive to an applied voltage. Because the varactor is typically noisy and lossy, particularly in applications above 500 MHz, it is ineffective for high-frequency, low-loss applications where high performance is required.

Another alternative, a micro-electro-mechanical-system (MEMS) is a miniature switching device that may switch between capacitors responsive to an applied control signal. It, however, is costly, difficult to manufacture and of unproven reliability. In most cases, it provides discrete tuning, in that a system must select between a finite (and small) number of fixed capacitors.

Ferroelectric tunable capacitors are another alternative that has been attempted. Ferroelectric (f-e) materials are a class of materials, typically ceramic rare-earth oxides, whose prominent feature is that their dielectric constant ($\kappa$), and as a consequence, the electric permittivity ($\epsilon$) changes in response to an applied slowly varying (DC or low frequency) electric field. The relationship of the dielectric constant ($\kappa$) and the electric permittivity ($\epsilon$) of a material is given as follows:

$$\epsilon = \kappa \epsilon_0$$

where $\epsilon_0$ is the electric permittivity of a vacuum. At present, there are several hundred known materials that possess f-e properties. In a typical f-e material, one can obtain a range in $\kappa$ by a factor of as much as approximately 3:1. The required DC voltage to generate such a change in $\kappa$ depends on the dimensions of the f-e material over which a DC control voltage is applied. As a result of their variable dielectric constant, one can make tunable capacitors using f-e materials, because the capacitance of a capacitor depends on the dielectric constant of the dielectric proximate the capacitor conductors. Typically, a tunable f-e capacitor is realized as a parallel plate (overlay), interdigital (IDC), or a gap capacitor.

In known f-e variable capacitors, a layer of an appropriate f-e material, such as barium strontium titanate, $Ba_xSr_{1-x}TiO_3$ (BSTO) is disposed adjacent to one or both conductors of a capacitor. Depending upon the strength of the electric field applied to the f-e material and the intrinsic properties of the f-e material selected, the capacitance changes. Typically, below the Curie temperature, $T_c$, of the f-e film, the f-e material is in the ferroelectric state and will exhibit hysteresis in its response to a changing electric field. Above $T_c$, f-e material is in the paraelectric state and will not exhibit hysteresis. Thus, one generally picks an f-e material whose $T_c$ is lower than the expected operating temperature so as to operate in the paraelectric state, avoiding the hysteresis effects of the ferroelectric state.

However, conventional f-e variable capacitors have proven to be too lossy for use in insertion-loss-sensitive applications such as handsets. Moreover, these devices often perform unpredictably, preventing optimal design, construction, and use of f-e tunable filters.

Duplexers are used in CDMA technology to separate the Tx and the Rx frequencies into their respective signal paths. Duplexers typically comprise two bandpass filters. Each filter selects either the Tx or the Rx frequency signal to be passed. The filters are coupled at one end, forming a common port. This common port is typically coupled to an antenna or a diplexer for sending transmit signals and receiving receive signals.

Strict insertion loss and out-of-band rejection requirements are the primary requirements that influence the design of duplexers for use in loss sensitive applications, for example, in wireless handsets. Other electrical and mechanical specifications must also be satisfied, such as, for example, size and height requirements.

Accordingly, there is a need in the art for improved tunable f-e filters capable of providing a tuning range over a desired frequency range with low I.L. and high out-of-band rejections and methods for designing the same. These filters could then be used to make tunable duplexers.

SUMMARY

In CDMA wireless handsets, strict insertion loss and out-of-band rejection requirements generally mandate high order (>$3^{rd}$ order) filters for use in duplexers. The in band insertion loss requirements generally apply over a frequency broader than that used for operation at any given time. This means that a fixed tuned filter for use in a duplexer must have a broader passband than would a tunable filter used by tuning over that same passband. Because the tunable filter could have a smaller (tunable) passband, it could be lower order (taking up less space) or it could have less insertion loss, or both.

This is only true though, if adding tunability does not increase the insertion loss of the duplexer beyond an acceptable limit. The invention provides for a ferro-electric tunable capacitor and capacitor and resonator circuit that makes a duplexer tunable, while maintaining low insertion loss.

Thus, a low insertion loss tunable duplexer which is smaller and has less insertion loss than a fixed tuned bandpass filter that could cover the same passband is provided. A tunable multiplexer providing for more than two bands is also provided. The space savings in a wireless handset can be used to provide other desired functions and properties, or it can be used to simply reduce the size, weight or cost of the handset. Additionally, the savings in insertion loss results in a longer talk time and battery life.

BRIEF DESCRIPTION OF THE DRAWINGS

FIG. 2b is a plan view of the first metal layer in the overlay capacitor of FIG. 2a.

FIG. 2c is a cross-sectional view of the overlay capacitor of FIG. 2a taken along line B in FIG. 2a.

FIG. 3 illustrates an enlarged view of area C in FIG. 2a.

FIG. 11a is a plan view of the tunable filter shown in FIG. 8a.

Use of the same reference symbols in different figures indicates similar or identical items.

DETAILED DESCRIPTION

Figure 1A:
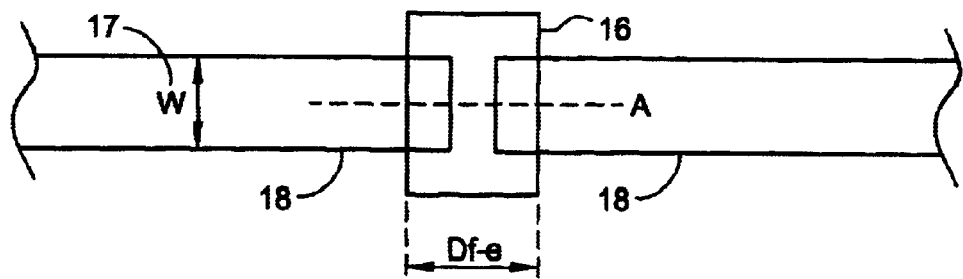
FIG. 1a is a plan view of a ferro-electric gap capacitor.

In designing a tunable bandpass filter (BPF) for use and application in electronic signal processing systems, such as, for example, communications systems, one must usually meet or exceed both out-of-band rejection and pass band insertion loss (I.L.) requirements as well as size, weight and other mechanical, environmental and electrical requirements imposed on fix-tuned BPF's.

Thus, for a tunable BPF to be a commercially viable replacement for a fixed-tuned BPF, its performance should exceed that of the fixed-tuned BPF performance should exceed that of the fixed-tuned BPF it is replacing in terms of most or all of the electrical and mechanical requirements. In demanding applications such as wireless handsets, passband I.L. must be minimized to prevent placing an even greater burden on other components in the handset. If a tunable BPF has I.L. greater than the fixed-tuned BPF it is to replace, the added I.L. may prove to be too great a burden on the overall system performance. The added burden would usually be greatest on active devices like amplifiers. The amplifiers would have to have greater gain and power output to overcome the effects of increased passband loss over that of existing fixed bandwidth filters.

Many definitions of what defines a "pass band" may be used. Typically the pass band is defined by the points where the bandpass filter response falls to 3.0 dB below the mid-band, or band-center insertion loss (I.L$_0$.). However, any fixed filter response can be used to define the pass band. Higher order (more resonators) bandpass filters are typically required to meet a specific out-of-band rejection requirement. But increasing the filter order will increase the I.L$_0$. A useful basic relationship between filter order and I.L$_0$. is given by the following equation:

$$I.L_0. = (4.34 * Q_l / Q_u) * \sum_{i=1}^{N} g_i \qquad (1)$$

where N is the filter order, $Q_u$ is the unloaded Q of the resonators used, $Q_l = f_0 / BW$ (BW is the 3 dB passband and $f_0$ is the midband frequency), and $g_i$ are the filter element values for a given topology (Chebyshev vs. Butterworth).

Generally, a Chebyshev response is preferable as it gives a steeper rejection response compared to that given by a Butterworth filter for a given filter order. Additionally, increasing the ripple in a Chebychev BPF further increases out of band rejection. As can be seen from equation (1), for a given filter order N, a larger passband results in lower $I.L_0$. as $Q_l$ will decrease as BW increases. This lower $I.L_0$. comes at the expense of decreased selectivity. To regain selectivity, the filter order N must be increased, at the expense of $I.L_0$. One of ordinary skill in the art of bandpass filter design will appreciate that equation (1) represents the best one can do for a given system requirement and filter order. Using a higher order filter (more resonators of a given unloaded Q) quickly increases $I.L_0$., because the $g_i$ values get progressively larger in magnitude, even as there are more of them to sum (increased N). Note that equation (1) neglects implementation losses, which further increase $I.L_{\cdot 0}$, especially as the band edge is approached.

It can be seen from equation (1) that using a first or second order bandpass filter reduces $I.L_0$. At these lower orders, both the number (N) of the $g_i$ coefficients decreases as well as the magnitudes of the $g_i$. These low-order filters should be constructed from resonators that have the lowest loss (highest $Q_u$) so as to give the minimum $I.L_0$. possible. The resulting $1^{st}$ or $2^{nd}$ order bandpass filter will always have lower $I.L_0$. for a given resonator size and type (i.e., for a given $Q_u$) than the comparable fixed-tuned bandpass filter design of higher order. Tunability allows the low order narrowband BPF able to replace a wider band, fix-tuned BPF. A tunable narrowband low order BPF can cover the entire band of interest, overcoming the limitation of having a narrow bandwidth. This assumes that the desired channel (information) bandwidth is narrower than the total system bandwidth.

Tunable BPFs have the best chance of replacing fixed-tuned BPFs in those cases where the fixed-tuned BPF covers a system bandwidth that is greater than that required for transmission or reception of a single channel. For example, a fixed-tuned BPF in a handset for operation in the U.S. CDMA PCS band covers such a BW. It will be understood that this is also true of U.S. cellular CDMA and many other standards. The techniques, methods and devices taught herein are applicable to many standards besides U.S. CDMA PCS. U.S. CDMA PCS is discussed as an example only.

In the U.S. PCS band, 60 MHz is allocated for Tx (1850 to 1910 MHz) and 60 MHz for Rx (1930 to 1990 MHz). The CDMA standard is a full duplex system, meaning the handset must simultaneously transmit and receive. To accomplish this, a duplexer filter is needed to separate the bands and prevent interference. While the PCS band is 60 MHz wide, the individual CDMA channel is only 1.25 MHz wide. Current system architecture, however, forces CDMA PCS bandpass filters and multiplexers (including duplexers) to have a BW$\geq$60 MHz as the system must allow for and accommodate operation of any 1.25 MHz channel in any region of the 60 MHz band.

A tunable PCS band filter could alter this situation by meeting the worst case rejection specifications while providing a lower order BPF of simpler topology that occupies a smaller physical area. Such a lower order filter would necessarily provide lower $I.L_0$. by virtue of equation (1).

To effectively replace a high-order fixed-tuned BPF with a low-order tunable BPF, three factors should be considered. First, the bandwidth (i.e. $Q_l$) of the low-order BPF and the chosen topology must be such that the worst case rejection specification is met. Because $Q_l = f_0/BW$, as the 3 dB bandwidth (BW) decreases, the I.L. increases. Thus, if BW is too small relative to $f_0$, the resulting BPF will have an unacceptably high I.L., requiring a tradeoff between BW and I.L.

Figure 10:
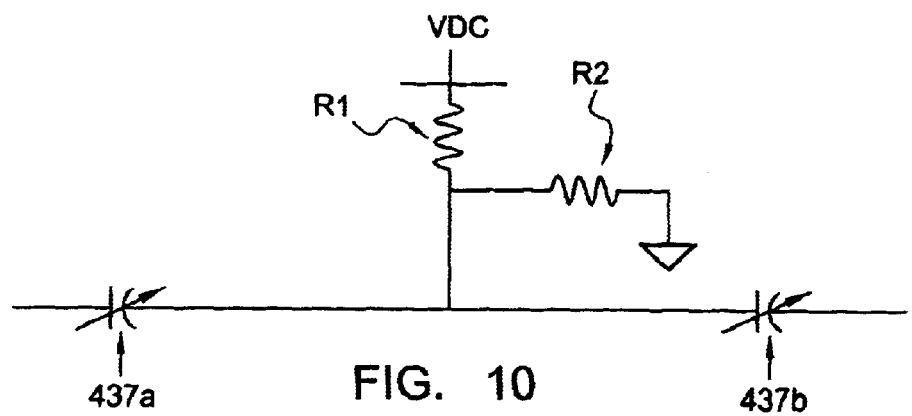
FIG. 10 shows one implementation of the divider network shown in FIG. 9.

For practical designs, a low-order tunable BPF should have the lowest possible I.L. consistent with meeting the worst-case required rejection. Some topologies are preferred in that they naturally provide a low side (below the transmission band) zero or a high side (above the transmission band) zero. A topology such as that shown in FIG. 10 is capable of providing a lower passband I.L. because the BPF $Q_l$ is smaller (because bandwidth is greater) or the ripple (manifested in the $g_i$ terms of the corresponding Chebychev BPF) is lower or both. The transmission zero provides the extra required rejection over a certain frequency range.

Second, the low-order tunable filter must be tunable to cover the entire BW, just as with a fixed-tuned filter. Finally, the tunable capacitor used within the low-order tunable filter should be of sufficiently low loss so the resulting filter has an I.L. that meets or exceeds specifications. Although a tunable $1^{st}$ or $2^{nd}$ order bandpass filter will be of minimum added loss compared to a higher order (N>2) fixed-tuned bandpass filter design, the tunable component (variable f-e capacitor) must have a fast tuning mechanism and be tunable to cover the entire bandpass range, using the available tuning voltage.

The total loss of a capacitor, $L_t$, whether tunable or not, is given by a ratio of its dissipated to stored energy, where the energy is stored in the electric field and dissipated in resistance, i.e., $L_t$=(dissipated energy)/(stored energy). The inverse of this loss is the quality factor, Q. For a capacitor, $L_t$ may be given by the quantity ($\omega*R_S*C$), where $\omega$ is the frequency in radians, $R_S$ is the total series resistance of the capacitor, and C is the capacitance.

The importance of determining the total loss given by an f-e capacitor in a resonant circuit can be seen from the following equations: $L_c=1/Q_c$ and $1/Q_T=1/Q_c+1/Q_u$, where, $L_c$=the loss of the capacitor;

$Q_T$=the total Q of the f-e capacitor and the resonator or inductor combined;

$Q_c$=the Q of the capacitor; and $Q_u$=the Q of the unloaded resonator or alternatively, the Q of an inductor used to create a parallel resonant circuit.

As $Q_c$ increases, it will affect the $Q_T$ less and less. If $Q_c$ is infinite, it has no affect on $Q_T$. For practical purposes, this is also true if $Q_c$ is approximately $10*Q_u$. The converse is true too. As $Q_u$ becomes higher and higher relative to $Q_c$, $Q_u$ has less and less effect on $Q_T$. In either case, the highest practical $Q_c$ is desired.

For a useful example for use in the PCS band, for a 1.0 pF tunable capacitor to have a $Q_c$=250 at 2.0 GHz requires that $R_S$ be 0.32 $\Omega$ (ohms). To minimize loss (obtain a low $R_S$), requires an accounting of all loss mechanisms present and an elimination of these loss mechanisms if possible.

For f-e devices, the total loss is governed by summing each source contribution as follows:

$$L_t = L_{geom} + L_{attach} + L_{metal} + L_{sub} + L_{rad} + L_{meas} + L_{f-e};$$

where $L_{geom}$ is derived from the topology of the capacitor, $L_{attach}$ is loss due to device attachment, $L_{metal}$ is the total metal loss, $L_{sub}$ is the base substrate loss (if present), $L_{rad}$ is the radiation loss, both desired and undesired, $L_{meas}$ is the total loss arising from measurement errors, and $L_{f-e}$ is the f-e loss tangent.

This loss allocation can first be used to obtain an accurate value of $L_{f-e}$ (or f-e tan $\delta$) at the desired operating frequency in the manner in which the f-e capacitor will be used. To correctly derive $L_{f-e}$ one must eliminate or constrain all of the other loss contribution sources just described. For example, $L_{geom}$ will vary according to topology, being best for an overlay capacitor, worse for a gap capacitor, and much worse for an IDC capacitor. Although this loss can be reduced and controlled, it is inherent to a device. Consequently, the choice of topology for a given f-e capacitor will affect the best possible $Q_c$ attainable from the f-e capacitor. Electromagnetic (EM) software can establish a baseline loss for a desired geometry, assuming a lossless f-e film. This baseline loss represents the best (lowest) loss for a given geometry.

In general, a gap capacitor is easiest to fabricate. An IDC is next easiest, and an overlay capacitor is hardest of these three. Compared to an IDC, the gap capacitor will have a better Q but lower capacitance per unit cross section (W in FIG. 1a). The IDC's capacitance is greater due to the use of a number of fingers per unit cross section. For many communication filter applications, however, large capacitance ($C \geq 4.0$ pF) is not needed. Thus, a gap capacitor often can provide adequate capacitance. The inherently high value of κ for most f-e films helps provide relatively high capacitance per unit cross section, W, compared to a conventional gap capacitor.

$L_{attach}$ arises from discrete device attachment techniques, including, for example, solder, silver paint, or wire bonding. These attachment losses may be large and unpredictable. The lowest losses are achieved by direct fabrication of the f-e capacitor to the resonator or other RF circuitry, thus minimizing if not eliminating this loss component.

The inherent loss of a stand-alone f-e capacitor is of little consequence. What is of much greater consequence is any added loss arising from the attachment of the f-e capacitor to a circuit. Even if the f-e capacitor were lossless, should a large loss connection be used, the overall effect is that of a lossy f-e device. For example, if a $Q \geq 250$ at 2.0 GHz is desired for a capacitance of 1.0 pF, then the total series resistance $R_S$ must be $\geq 0.32$ ohm. Any additional loss will thus further reduce the Q of this capacitor. That this additional loss is external to the actual capacitor is irrelevant. Even unavoidable loss mechanisms, such as those due to mounting, for example, lower the effective Q of the capacitor from the perspective of its effect on the system.

For minimum added loss, the connection between the f-e capacitor and the resonator should provide the lowest added resistance. Thus, the electric currents and charges associated with the f-e capacitor should see a minimum added loss. Conventional bonding or mounting techniques, such as (but not limited to) soldering, wire bonding or silver paint or paste do not provide for such a low loss, controllable bond.

The added, unpredictable loss arising from the use of such bonding methods degrade the realized Q regardless of whether or not the f-e capacitor is being used for resonator tuning purposes or characterization of an f-e film. Thus, for best performance (lowest loss) the f-e capacitor structure should be directly fabricated onto or with the resonator it is meant to tune or onto other essential RF circuitry. Only by direct fabrication can there be a minimum loss transition for electromagnetic (EM) sources (currents) from the f-e tuning elements to the resonator. The desirable effects of direct f-e capacitor fabrication onto or with a resonator can be enhanced by the lack of sharp corners or transitions.

Factors for $L_{metal}$ include the surface roughness (SR) of the metal, metal thickness as compared to skin depth, δs, and conductivity. SR may be effectively eliminated as a factor if SR is less than approximately 10 micro inches root mean square (rms) for operating frequencies in the L and S band (1–4 GHz). The metal thickness may be reduced as a factor if the thickness is 1.5δs or greater, or effectively eliminated if the thickness is $\geq 5\delta s$. For electrode contacts, metal thickness ($t_m$) can be approximately 1.5δs. For the case of electromagnetic resonators, where a travelling or standing wave must be supported, i.e., where the metal in question extends for an appreciable fraction of a wavelength (about 10% or greater), the metal thickness should be closer to about 5δs or greater.

Conductivity is best for Au, Cu, or Ag. Thus, $L_{metal}$ can be reduced and controlled, but not eliminated as a factor. Its effect, however, can be calculated by expressions well known to those skilled in the art, or by using line calculator tools available in commonly used circuit simulators, such as Eagleware or Touchstone. Further, precise fabrication control can bound geometric variations in $L_{metal}$.

The loss contribution represented by $L_{sub}$ may be minimized by choosing a low loss substrate with a loss tangent less than 0.001 and preferably less than 0.0005 at the operating frequency of interest. Suitable materials include >99% pure alumina, a best current choice for loss/cost benefits. Sapphire or MgO are better than alumina in that they have lower loss tangents, but they are more expensive. All these materials will accept f-e thin films without buffer layers and have a surface roughness that is acceptable with little or no further polishing. Semiconductor substrates are poor choices because of their relatively high conductivity. In addition to the factors of loss tangent, surface roughness and price, suitable substrates should not be brittle, can be fabricated as larger area wafers, and can be easily metallized without extensive pre-processing.

Separating out $L_{sub}$ from the total loss of a composite substrate (f-e film plus substrate) can be achieved by using EM field or circuit simulation software. For example, Sonnet, Momentum, or IE3D may be used. Thus, $L_{sub}$ can be reduced significantly and calculated precisely.

$L_{rad}$ can be eliminated by proper shielding and design, and so is typically not a factor. It should be noted that a wide variety of filters, especially planar filters such as combline or hairpin, depend upon radiative coupling to achieve their desired performance. In these cases, one should ensure that the unwanted, stray coupling is reduced, if not eliminated.

$L_{meas}$ can add significantly to the circuit loss error because small, added loss significantly reduces the measured Q of the device-under-test (DUT) or system thus obscuring the intrinsic Q of the DUT. The conventional method for measuring dielectric constant and loss tangent in a material is the cavity perturbation technique, which is well known to anyone skilled in the art. At L-band, however, the size of the cavity becomes quite large. When characterizing thin films (as opposed to bulk) with film thickness $\leq 1.5$ μm, such as f-e films, the problem becomes very difficult as measurement errors can be severe. Furthermore, one should characterize an f-e capacitor (or filter) in a manner most similar to how it will be used. Thus, the preferred way to characterize f-e compounds or films is by microstrip resonator techniques.

For the purposes of determining f-e film characteristics and characterizing f-e capacitors, microstrip techniques are preferred to, for example, stripline or other volumetric techniques for f-e film characterization for the following reasons:

1) Microstrip circuits are planar systems with no top cover, so no bonding of hard substrates as top covers is required. So there is also no need for continuity of ground planes (top to bottom) as needed in a stripline, for example.
2) Preferably gap capacitors, and alternatively, IDC's, can be readily fabricated and measured.

3) A large body of knowledge exists as to the characterization of microstrip resonators.

4) No complex fixturing or fabrication or both are needed as are required for dielectric cavities, for example.

One should measure high-Q circuits using resonator techniques because broadband measurement may not accurately resolve sub-ohm resistive losses at RF/microwave frequencies with any accuracy. For the same reason, LRC meters are not a good choice.

Measurement at radio frequency is required to correctly obtain Rs and consequently Q, for an f-e capacitor, since low frequency measurement, especially those below about 100 MHz, is dominated by a large parallel resistance, Rp, that shunts the capacitance in question. The dominance of Rp, along with the relatively small values of the capacitance in question ($\leq 4.0$ to 5.0 pF) prevents reliable Q (and therefore Rs) measurement at low frequencies.

When used to measure losses, wafer probe stations must be carefully used because it is difficult to calibrate out resistive and inductive loss at RF/microwave frequencies. Probe tips along with their ground connections are also sensitive to placement on the DUT as well as the pressure used to apply them. As a consequence, it is better to use a resonant test circuit that allows for direct measurement of the desired parameters in a way that does not require individual device loss measurements.

Thus, for measurements on resonant circuits, a network analyzer is the preferred choice. To minimize measurement loss and attain the most accurate measurement, one should calibrate out loss to the DUT, perform a full two port calibration of the network analyzer, and use averaging for calibration and measurement. Finally, proper analysis of the measured data, such as that outlined in "Data Reduction Method for Q Measurements of Strip-Line Resonators," IEEE Transactions in MTT, S. Toncich and R. E. Collin, Vol. 40, No. 9, September 1992, pp. 1833–1836, hereby incorporated by reference, is required to accurately extract the Q, or loss, of the capacitor under test.

Using the results of above discussion to minimize, eliminate, or bound each of the foregoing losses, the total loss may be re-expressed as:

$$L_t = L_{geom} + L_{metal} + L_{f-e} + \Delta L_{misc}$$

As discussed above, both $L_{geom}$ and $L_{metal}$ may be quantified and removed analytically. $L_{geom}$ can be determined from an accurate electromagnetic simulation of the circuit based on a lossless f-e material assumption. $L_{metal}$ can be determined using the expressions for metal loss assuming conductivity, SR (if applicable), and skin depth. The final term, $\Delta L_{misc}$, represents a combination of the incomplete removal of the other loss mechanisms or from the finite bounds on or incomplete removal of $L_{metal}$ and $L_{geom}$ or both. As such it represents an irreducible error term. For accurate measurements of f-e film/component properties, it should be minimized and bounded, as described in the preceding sections.

Finally, to reduce the effect of $L_{f-e}$ to a minimum one must use selective f-e film deposition to place the f-e film only in regions where it is needed for tuning and nowhere else.

The process of accounting for all loss mechanisms and eliminating or bounding these losses not only determines f-e loss but also establishes correct design guidelines for low-loss tunable filters. Knowledge of $L_{f-e}$ gives the designer a baseline for the f-e film that is necessary for doing any type of optimum design using f-e films. This knowledge is necessary if one is to effectively trade-off loss tangent for tunability, for example. In short, accurate fabrication and measurement techniques result in consistent f-e film loss characterization and application.

Given the above techniques for minimizing loss, preferred embodiments for the three types of f-e capacitors may now be discussed. It will be appreciated, that although these designs are for use in the L band (1–2 GHz), the teachings of the present invention may be used to design f-e capacitors for other frequency bands.

Figure 1B:
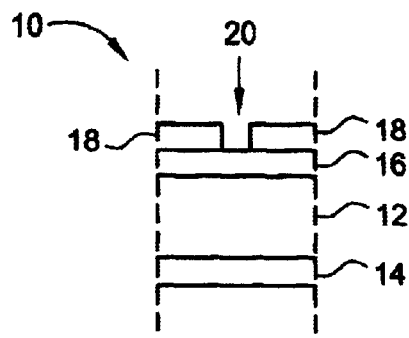
FIG. 1b is a cross-sectional view of the ferro-electric gap capacitor of FIG. 1a taken along line A.

A preferred f-e tunable gap capacitor 10 is shown in FIGS. 1a and 1b for use in the cellular band (800 to 1000 MHz) and the L-band (1–2 GHz) for wireless handsets. The gap capacitor 10 is preferably formed on a $\geq 99\%$ pure, 0.5 to 1.0 mm thick alumina, MgO, or sapphire substrate 12, having an SR less than a 5.0 micro inch RMS. Alternatively, the gap capacitor can be directly patterned on the front or rear face or a side-wall of any number of resonators structures. Examples are coaxial, monoblock or stripline resonators. Such a capacitor should be fabricated as close to its point of electrical connection to the resonator as possible.

The substrate 12 may have a metal ground plane 14 depending on other requirements. However, the preferred embodiment is without a ground plane to minimize stray capacitance. Preferably, a f-e layer 16 of approximately 0.1 to 2.0 microns in thickness formed of BSTO or other suitable or desirable f-e material for maximum capacitance and tuning range is deposited on the substrate 12. More preferably, layer 16 is 0.5 to 1.0 microns in thickness. The Ba/Sr fraction, doping, alloying, mixing with other components, and/or annealing determine the desired tuning characteristics and loss (tan $\delta$), and therefore Q also.

Generally, it is preferred that the tuning characteristics meet the minimum required tuning range with the minimum tuning voltage. Preferably, x=0.5 in the $Ba_xSr_{1-x}TiO_3$ composition for room temperature operation, regardless of doping with other elements and pre- or post-process annealing. It will be appreciated that other f-e materials beside BSTO may be used as well. A metal layer 18 formed on the f-e layer 16 defines a gap 20 that is preferentially 3.0 to 5.0 microns wide. Preferably, metal layer 18 is 0.5 to 6.0 microns thick. More preferably, metal layer 18 is 1.5 to 2.5 microns thick. It will be appreciated that the gap 20 can be wider or narrower than this range depending on requirements and processing equipment. For minimum added loss in the PCS band, the resulting capacitance will be approximately 0.6 pF to 1.5 pF at 0 volts DC while for the cellular CDMA band it will be about 1.0 pF to 3.0 pF. The width of the capacitor, W 17, will further determine the f-e capacitance, depending on the particular f-e film used and the desired gap 20. The width will typically be from 0.25 mm to 2.0 mm. The capacitance is typically 0.6 to 3.0 pF. The resulting capacitor should provide a Q of at least 160 at 2.0 GHz to meet the existing worst case CDMA PCS band BPF loss specification.

To minimize the added loss from the f-e film, selective deposition must be used, i.e., the f-e film is deposited only where needed for tuning and nowhere else as stated above. For example, in the gap capacitor 20 of FIG. 1a, one could deposit the desired f-e film 16 in a narrow region $D_{f-e}$ around the gap 20, as shown in FIG. 1a. $D_{f-e}$ should be large enough to ensure that the gap 20 can be repeatedly patterned over the f-e film in manufacturing (allowing for mask alignment tolerance) and to cover the needed area under the gap 20 for tuning purposes. For the L-band PCS filters, $D_{f-e}$=0.2 to 0.5 mm is adequate with 0.2 mm preferred. As the operating frequency increases $D_{f-e}$ can decrease. As the operating frequency decreases, $D_{f-e}$ can increase.

F-E film properties and fabrication will play a significant role in overall capacitor loss. Many techniques exist to mitigate and minimize f-e film loss. One feature of f-e films is that f-e film loss and tunability usually have an inverse relationship. That is, they usually must be traded off against each other. The greater the f-e κ tuning range, the greater the f-e loss in most cases.

Thus, even though f-e materials can achieve a κ tuning range of about 3 to 1, less tuning may be acceptable for a given filter application. In that case, less tuning would be chosen, with the benefit of less loss. For example, in the U.S. PCS CDMA band, the tuning requirement in the transmit band is from 1850 MHz to 1910 MHz, or about 4%. Thus, the f-e material can have significantly less tunability than 3 to 1.

For example, an f-e gap capacitor with 0.6 pF at 0V DC bias, needs to tune 33%, (from 0.6 pF down to 0.4 pF) to tune over the PCS transmit band. The actual tuning range depends on the BPF topology and the band over which the BPF must be tuned. The required tuning voltage to provide the 33% tuning in this example depends on the f-e capacitor geometry, including f-e film thickness, and the f-e film characteristics.

The effect of κ tunability on frequency tunability is determined by the filter topology. This effect must also be considered in choosing an f-e material. But without accurate characterization of the f-e loss to f-e κ tunability trade-off, a designer cannot even begin to choose an optimum f-e material. Accurate characterization of this trade-off allows a designer to choose an optimum f-e material (providing the lowest loss while meeting the tuning requirements).

With respect to $L_{geom}$ for a gap capacitor, the major contributions to loss are the four corners formed by the gap. These losses can be reduced by rounding the corners.

In comparison to gap and interdigital capacitors, an overlay capacitor has the lowest $L_{geom}$. An overlay capacitor is an example of a parallel plate geometry where the plate dimensions (length and width) are much greater than the plate separation. Given such a geometry, most of the electric field between the plates is uniform except for fringing along the edges. The fringing effect can be reduced significantly by the use of a guard band, as is well known in the art. Thus, the geometric loss from a parallel plate capacitor is quite low. In addition, parallel plate geometries can provide high capacitances along with high tuning from small control voltage swings.

Figure 2A:
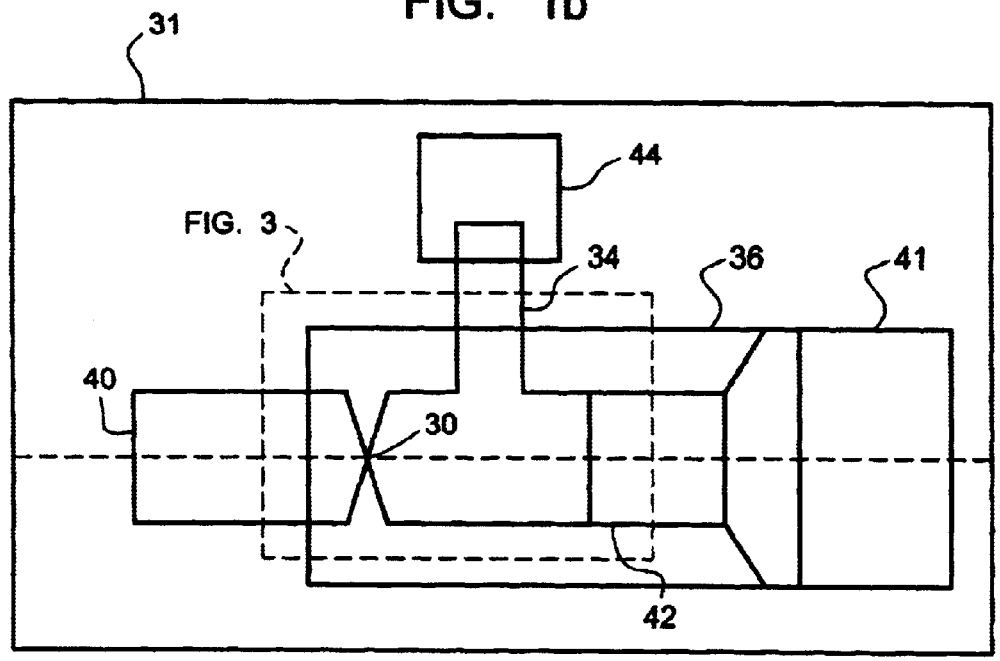
FIG. 2a is a plan view of a ferro-electric overlay capacitor, along with an accompanying DC blocking capacitor.
Figure 2B:
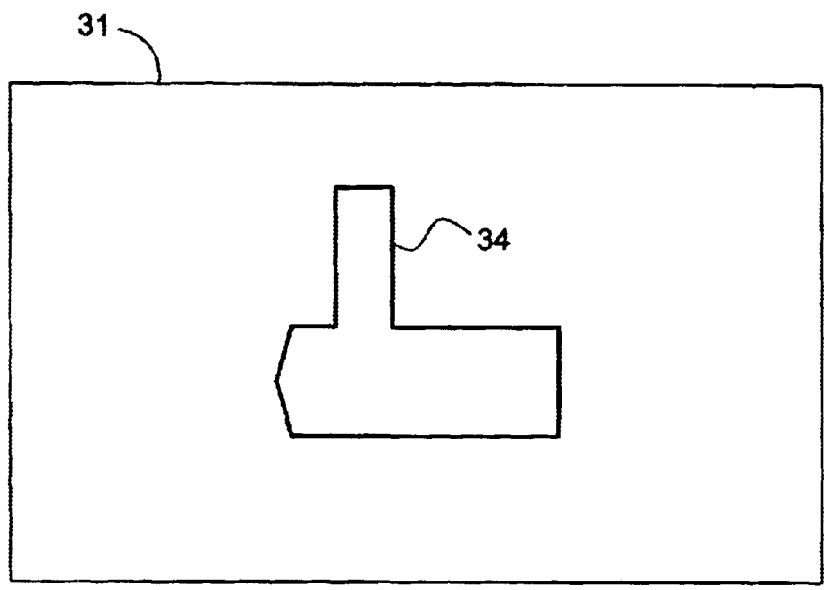
Figure 2C:
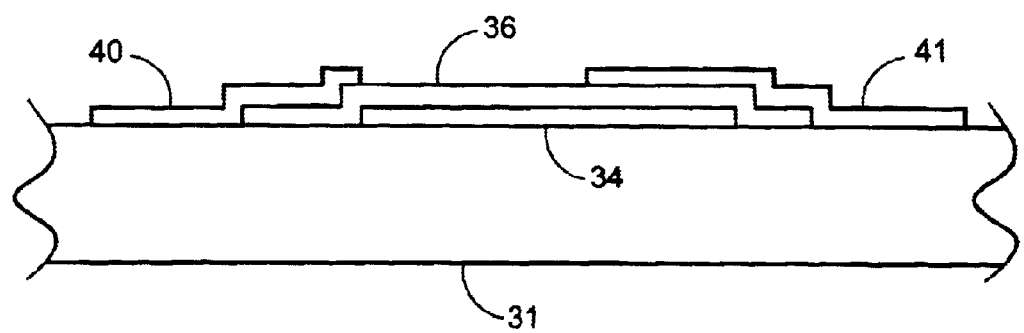
Figure 3:
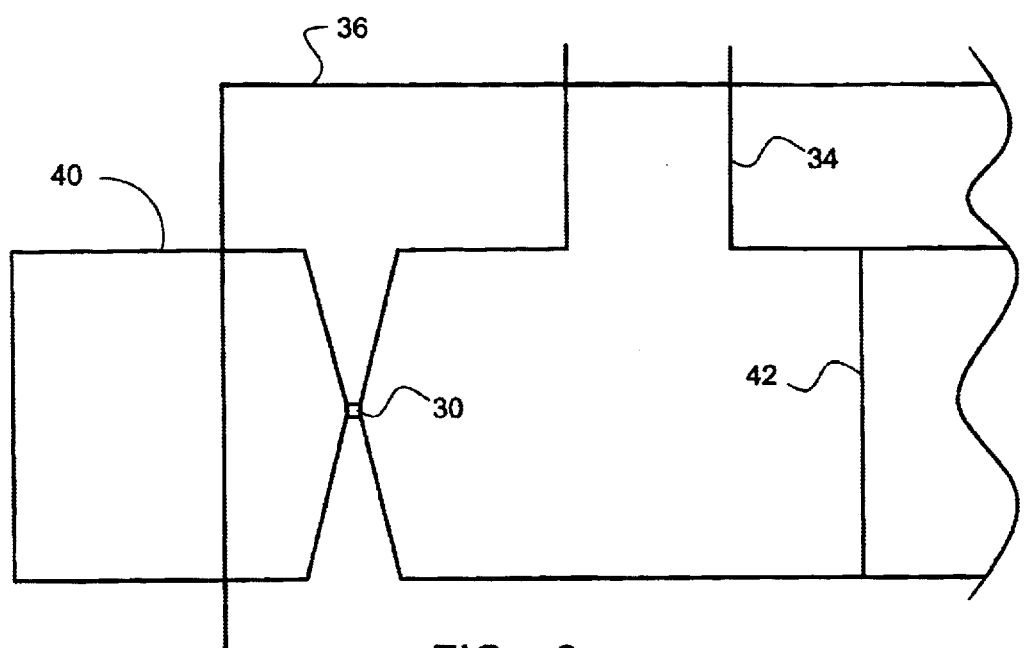

A preferred overlay capacitor 30 is illustrated in FIGS. 2a, 2b, 2c, and 3 that minimizes contributions to $L_{geom}$. The capacitor 30 is deposited directly on a 25 mil alumina substrate 31. A first metal layer 34 bonds to the substrate 31. The shape of metal layer 34 is also illustrated in FIG. 2b. A ferro-electric layer 36 overlies the metal layer 34. To form the overlay capacitor 30, a metal pad 40 formed on the ferro-electric layer 36 overlaps a portion of the first metal layer 34. FIG. 3 illustrates an enlarged view of the overlapping portions. Both the metal pad 40 and the metal layer 34 have a tapering region that forms an overlay capacitor 30 of the appropriate capacitance. An additional metal pad 41 overlaps the metal layer 34 to form a DC blocking capacitor 42. The metal pad 41 is tapered to form an appropriate capacitance for the DC blocking capacitor 42.

Due to the high dielectric constant (κ) of the most likely f-e films to be used, the overlay capacitor 30 may be quite small in area and still provide a capacitance ($C_{f-e}$) of 1.5 pF. A bonding bias pad 44 is provided for attachment of a high value (500–1000 kΩ) chip resistor. Note that the f-e film is deposited not only under the overlay capacitor 30 but also the blocking capacitor 42. However, the effect on the capacitance ($C_{DC}$) of the DC blocking capacitor 42 is irrelevant if $C_{DC} \geq 180$ pF and $C_{f-e} \leq 1.5$ pF, even under maximum $V_{DC}$ bias (preferably 10V DC). This is because the DC blocking capacitor has a high enough capacitance that even when the capacitance is reduced by f-e tuning, it still has a minimal effect on $C_{f-e}$.

In such an embodiment, $0.7 \leq C_{f-e} \leq 1.5$ pF, f-e κ is approximately 1000, the overlapped portion of the metal pad 40 forming the overlap capacitor 30 is approximately 7.0 μm×7.0 μm, and the f-e film thickness is approximately 1.0 μm. The metal layer 34 may be Pt and have a thickness of $\leq 0.5$ μm. The metal pads 40 and 41 may be Ag and have a thickness of approximately 1.5–2.5 μm.

While the $L_{geom}$ of an overlay capacitor is lower than that of a gap capacitor, $L_{f-e}$ of an overlay capacitor may be higher, as all of the rf field is concentrated in the f-e film. In a gap capacitor the rf field is partially in air, partially in the f-e film and partially in the substrate. For the same reasons, an overlay capacitor has greater capacitance tunability for a given applied voltage than a gap capacitor.

For a given cross sectional area, an IDC can provide a higher capacitance than a gap capacitor. It is more lossy, however, with the main contributions to $L_{geom}$ including the gap spacing; loss increases as the gap spacing decreases. Similarly, loss increases as finger width decreases. The finger length also affects loss with loss increasing as finger length increases; especially in a microstrip (the most common) realization of an IDC as the odd mode loss dominates in such a structure. In addition, loss increases as the number of fingers increases due to loss introduced from the additional sharp corners; note that increasing the number of fingers is typically used to increase the capacitance of an IDC. Many investigators in the f-e area have used IDC's with narrow finger widths and gaps ($\leq 5.0$ μm for each) to characterize f-e film. This is problematic, as such an IDC structure gives a high $L_{geom}$ and therefore a low Q by itself. Typically, $Q \leq 200$ at 2.0 GHz for about 1.0 pF, even without any $L_{f-e}$. This makes it quite difficult to measure $L_{f-e}$. The wide spread use of broad band measurement techniques, as described above, further obfuscates any $L_{f-e}$ measurement.

Figure 4:
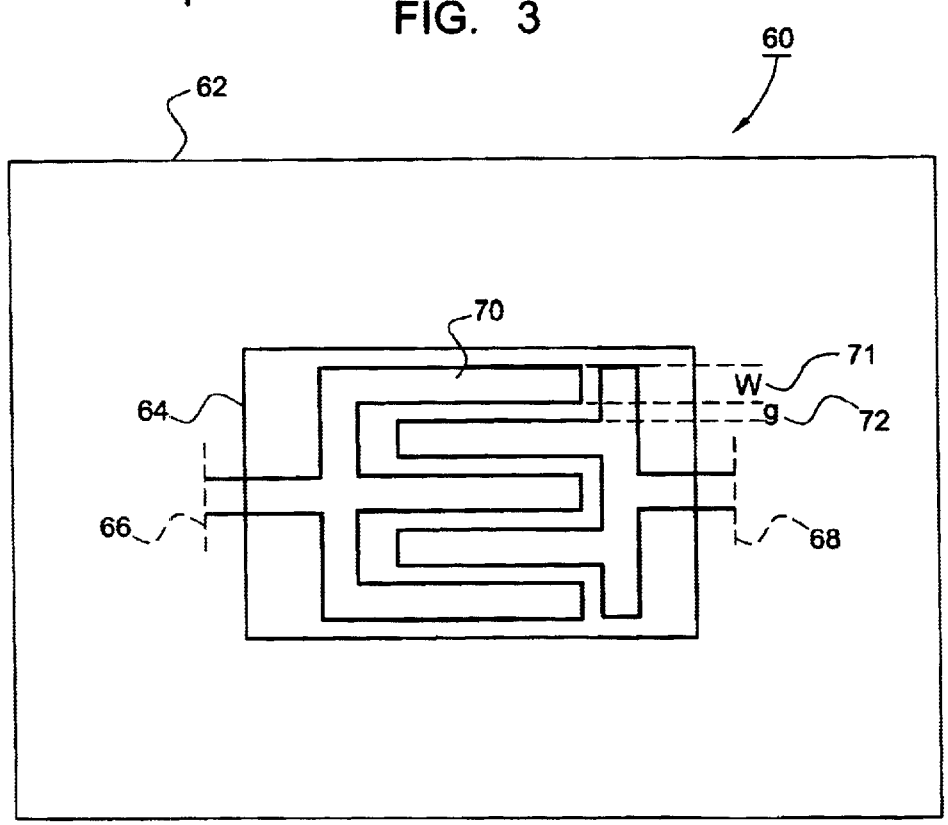
FIG. 4 is a plan view of a ferro-electric interdigital capacitor.

A preferred IDC capacitor 60 is illustrated in FIG. 4 that minimizes the contributions to $L_{geom}$. It is formed on a 99% alumina, MgO, sapphire or other suitable substrate 62 of thickness of approximately 0.2 to 1.5 mm. A f-e layer 64 is formed on the substrate 62. An input port 66 and output port 68 couple to the IDC capacitor 60. A metal layer 70 having a thickness of 1.5 to 3.0 microns and deposited on the f-e layer 64 forms a gap spacing 72 of approximately 5.0 microns and a finger width 71 of about 150 microns or greater if possible.

A general methodology for constructing a tunable bandpass filter may now be described. As a first step, a designer must tradeoff the 3 dB bandwidth of the tunable filter with filter order to achieve the required out-of-band rejection. As is well known, as the filter order is increased, its rolloff rate increases, making it easier to achieve a required rejection specification. The rolloff is modeled as beginning at either of the 3 dB points defining the 3 dB bandwidth (BW). Thus, as the BW is decreased, it also becomes easier to achieve a required rejection specification.

For minimum loss the lowest order filter is desired. Typically, this will be a $2^{nd}$ order BPF. A low order BPF has a further advantage of being simpler to fabricate and tune, using fewer tunable resonators.

A Chebychev prototype BPF is preferred over a Butterworth as this gives the designer more flexibility to trade off passband ripple with out-of-band rejection. The designer should strive to meet the worst case rejection specification by bandwidth adjustment without the addition of extra transmission zeros as transmission zeros increase filter complexity, cost and loss at the corresponding passband edge. One can, however, exploit topologies that have naturally occurring high or low side transmission zeros in this case.

Narrowing BW too much, however, will increase the insertion loss, as discussed above. Thus, the narrowest BW should be chosen that meets the required rejection specification over all specified operating conditions. If the chosen BW provides an unacceptable insertion loss, the BW should be increased, perhaps also requiring an increase in filter order or increased passband ripple (if acceptable). An additional high or low side transmission zero may be added if desired.

A tunable BPF requires control circuitry. This is an added expense, not required of fixed-tuned BPF's. Thus, a desirable tunable filter design should provide a decreased insertion loss, smaller size, or other benefit over that of a fixed-tuned BPF to offset this expense. To achieve decreased insertion loss and smaller size, it is preferable to use no more than a one or two stage tunable filter. However, it will be appreciated that the principles of the invention may be advantageously used to design tunable f-e filters of arbitrary order.

Figure 5:
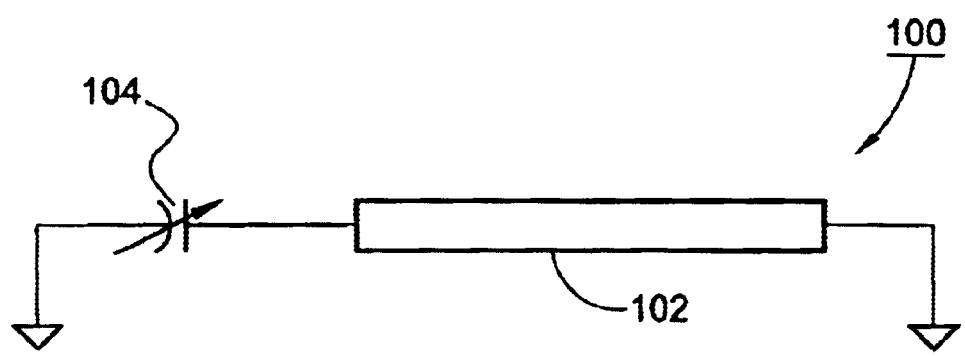
FIG. 5 is a schematic of a resonator coupled to a tunable ferro-electric capacitor.

Given a choice for filter order and BW that satisfies the rejection requirements, the highest possible $Q_u$ for a resonator should be used to meet or exceed the required I.L., given size and height constraints. To define $Q_u$, a topology should be chosen for the basic stage 100 illustrated in FIG. 5. Each stage 100 is formed by a resonator 102 coupled to a f-e capacitor 104. The f-e capacitor 104 may assume one of the forms described herein. The resonator 102 is shown as a grounded quarter wavelength resonator but an open circuit one-half wavelength resonator may also be used. Moreover, the resonator may be of other suitable electrical length.

Figure 6:
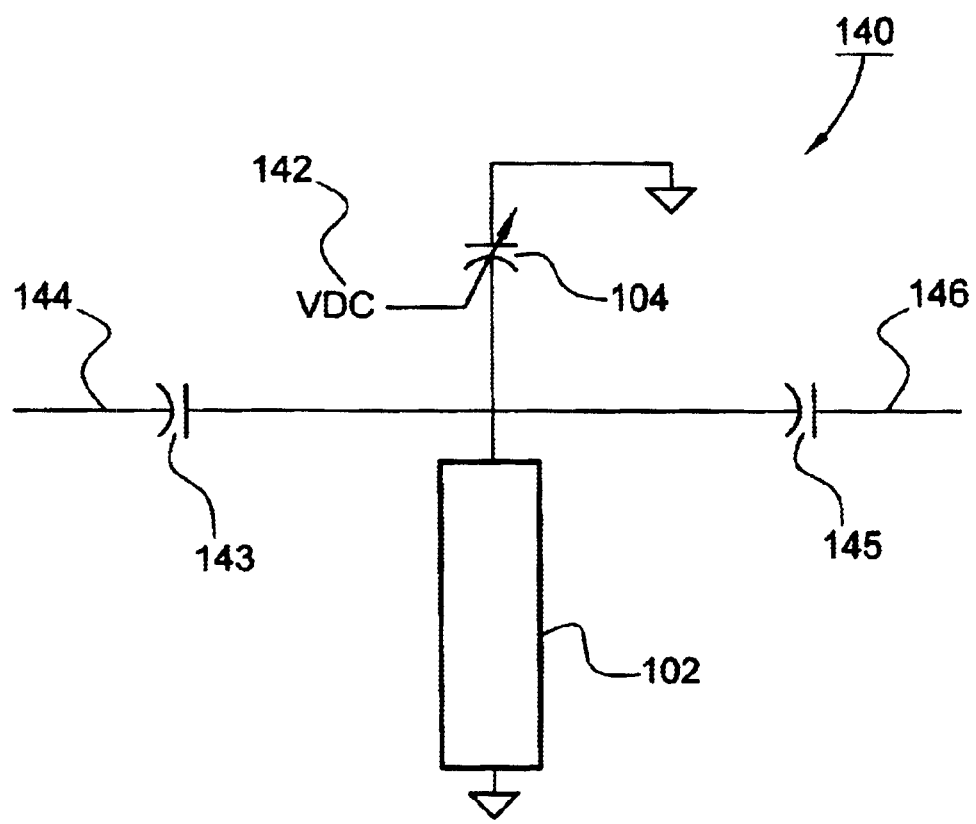
FIG. 6 is a schematic of a single pole tunable filter.

The basic stage 100 may be considered a tunable EM resonator. The f-e capacitor 104 may be coupled either in series or in shunt with the resonator 102 as determined by the nature of their connection. As shown in FIG. 6, the f-e capacitor 104 is coupled in shunt with the resonator 102 such that $Q_{f-e}$ of the f-e capacitor 104 affects the Q of the fix-tuned EM resonator 102. Volumetric resonators (e.g., coaxial, stripline, and monoblock) are preferred, as they provide the highest $Q_u$ and smallest area and height at a minimal price compared to planar, i.e., microstrip, alternatives.

Whether a tunable capacitor is placed in series or shunt with a volumetric resonator is often determined by the case of the connection; sometimes only one placement is even possible. Another key feature in determining whether a tunable capacitor is placed in series or shunt is that of minimum added loss and to a lesser extent, tuning range. A shunt connection will typically produce a more physically compact tunable filter than a series connection. It is usually easier to achieve as well. A series connection can provide better tuning in the case where electromagnetically coupled resonators (like monoblock, coaxial or stripline) are coupled along their entire extent (rather than coupled through a small aperture). A series connection is a more natural choice in these cases from a fabrication perspective.

As discussed above, the attachment losses may be significant if the f-e capacitor 104 is not integrated with the resonator 102 or other RF circuitry. Once a topology for the f-e capacitor 104 is chosen, its $Q_c$ may be derived as discussed above. $Q_T$ for the overall basic stage 100 is then given by $1/Q_T=1/Q_c+1/Q_u$, where $Q_u$ is the unloaded Q of the resonator 102;

and $Q_c$ is the Q of the f-e capacitor.

Given the $Q_T$ for the basic stage 100, the designer may use equation (1) to determine if the required I.L. will be achieved or exceeded. Should the I.L. be too high, the designer may obtain a lower I.L. by increasing either or both of $Q_c$ or $Q_u$. If either $Q_c$ or $Q_u$ cannot be increased further, they will ultimately limit $Q_T$. Further reduction of I.L.$_0$ can then be obtained only by switching to a lower loss topology. For example, $Q_u$ may be increased if a volumetric instead of a microstrip resonator is used for a given footprint (area).

For high volume applications, such as CDMA wireless handsets, transverse electromagnetic (TEM) wave volumetric resonators are preferred. Such volumetric resonators can be either ceramic loaded coaxial resonators, slabline (monoblock) or stripline, to name the three most common realizations. The standard narrow band (typically defined as a BW≦10% of $f_0$) topology can be realized using top capacitively coupled (TCC) BPF's fabricated with either coaxial or stripline resonators. The TCC topology as shown in FIG. 8, lends itself to shunt f-e tuning, as this provides the most compact realization (having a smaller footprint than a TCC topology with series f-e tuning). Also, the shunt quarter wave resonators behave as parallel LC tuned circuits near resonance.

Stepped impedance realizations of monoblock BPF's can be used as well. Monoblock resonators are typically EM coupled along their entire length, a direct consequence of their design. They lend themselves to series f-e tuning. Their electrical lengths can be tuned by the selective deposition and patterning of f-e tuning capacitors. Non-TEM resonators can be used as well, including, but not limited to, dielectric loaded waveguide resonators or dielectric pucks (with or without a shielded enclosure).

However, height restrictions may limit the achievable $Q_u$ from volumetric resonators. An alternative to a volumetric coaxial resonator in such height-constrained systems is to use a stripline resonator. Here, one can make the center conductor wider (up to a point) thus improving $Q_u$ while keeping the total height fixed. This embodiment has further merit in that the incorporation of a planar f-e capacitor such as a gap capacitor or IDC can be realized efficiently by making the top cover of the stripline resonator end before the location of the f-e capacitor. In this manner, the planar f-e capacitor would be formed on the portion of the substrate forming the bottom cover of the stripline resonator that extends beyond the top cover.

Regardless of the particular resonator being implemented, if height restrictions prevent any further increase in the $Q_u$ of the resonator, $Q_c$ would have to be increased instead by, for example, replacing an IDC f-e capacitor with a gap or an overlay f-e capacitor.

For many applications, a single stage bandpass filter 140 will be satisfactory as illustrated in FIG. 6. As discussed with respect to FIG. 5, the bandpass filter 140 will include the f-e capacitor 104 and the resonator 102. A variable DC voltage 142 applied to the f-e capacitor 104 tunes the filter 140. The RF signal to be filtered is applied at input port 144 and is output at output port 146. Note that the input port 144 and output port 146 are interchangeable. A capacitor 143 is defined both between the input port 144 and the resonator 102. Another capacitor 145 is defined between the output port 146 and the resonator 102. The f-e capacitor 104, regardless of whether it is a gap, overlay, or IDC capacitor, is constructed to minimize losses in the manner described above. Similarly, the resonator 102, which may be either a shorted ¼ wavelength resonator or a ½ wavelength open circuit resonator, is selected to maximize $Q_u$.

A higher $Q_u$ will be provided by a volumetric resonator such as a coaxial resonator, a dielectric loaded waveguide, a monoblock, or a stripline resonator in a smaller footprint and at a lower cost. Alternatively, a larger area planar resonator such as a microstrip resonator may be used if specifications and price constraints permit. Most microstrip resonator circuits would be fabricated by thin film process on a hard substrate. They can achieve less metal thickness and are of larger size since part of the EM field is the air region above the microstrip.

Figure 7:
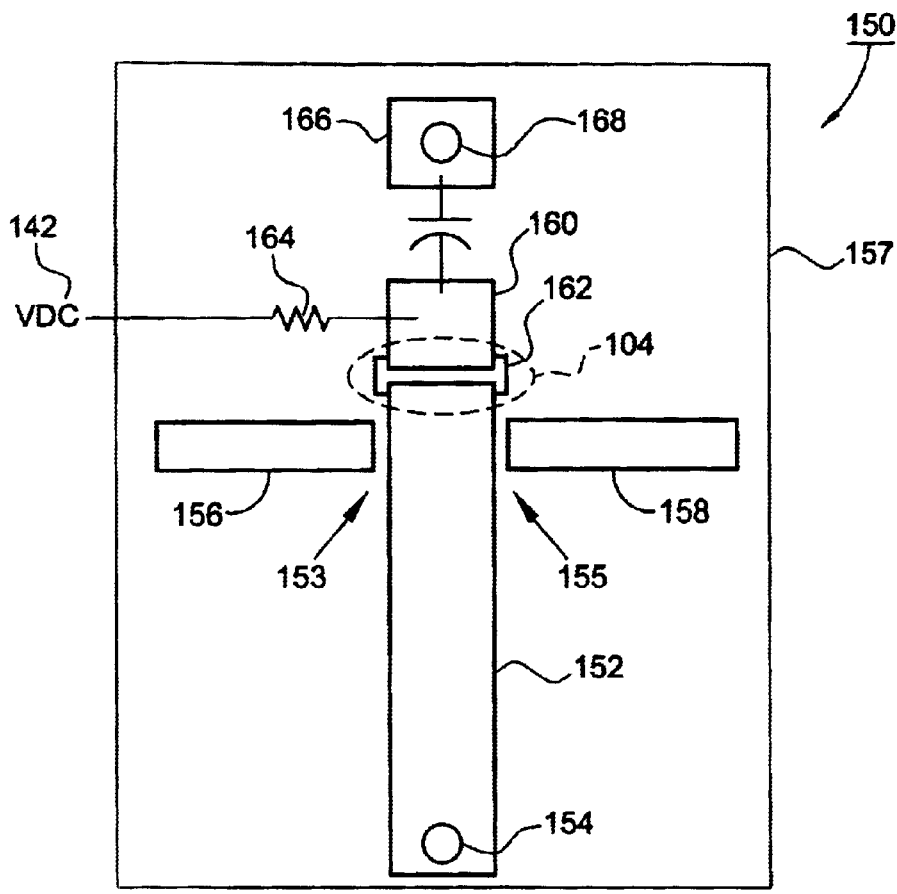
FIG. 7 is a planar circuit implementation of the single pole filter of FIG. 6

Turning now to FIG. 7, a planar realization 150 of the bandpass filter 140 is illustrated. Resonator 102 is formed by a microstrip line 152 grounded through via 154. Note that microstrip line 152 could also be terminated in a suitable lossless ground plane (not illustrated), obviating the need for via 154. Capacitors 153 and 155 are formed by gaps between the input and output microstrip lines 156 and 158 and the resonator microstrip line 152. It is desirable to make the capacitance of capacitors 155 and 157 as large as practical (approximately 0.2 pF) to maximize input and output coupling while still maintaining a planar structure. The microstrip lines are formed on substrate 157 of 99.5% pure alumina, MgO, or sapphire that is preferably of thickness approximately 1.0 mm for providing a maximum microstrip resonator Q. The f-e capacitor 104 is formed as a gap capacitor by pad 160 and mircrostrip line 152, with f-e layer 162 underneath pad 160 and microstrip line 152.

A variable DC voltage source biases pad 160 through resistor 164. A DC blocking capacitor is positioned between pads 160 and 166, where pad 166 includes a via 168 to ground. Note that pad 166 could also be terminated in a suitable lossless ground plane (not illustrated), obviating the need for via 168.

The DC blocking capacitor is needed if the resonator is shunted as shown in FIG. 7. The capacitance of the DC blocking capacitor is ideally at least $100C_{f\text{-}e}$ to minimize its loading effects on $C_{f\text{-}e}$. Its Q is ideally $\geq 40$ in the band of interest. It will be appreciated that the choice of a gap capacitor and a microstrip resonator is arbitrary—any of the forms discussed herein could be employed consistent with the teachings of the present invention.

The bandpass filter of FIG. 7 may be ideally used as a test circuit to characterize an f-e film as described herein. As such, the bandpass filter of FIG. 7 provides the following advantages:

1) The f-e capacitor can be fabricated as it is to be used, particularly if that realization is a gap capacitor or IDC. Selective f-e deposition is used.
2) While an f-e gap capacitor is shown, an IDC could be used as well. A gap capacitor has a simpler geometry. It is easier to fabricate and has lower geometric loss compared to an IDC. It is also easier to fabricate than an overlay capacitor.
3) Since the circuit is fabricated with thin film processing techniques the geometry can be precisely controlled and measured.
4) Metal thickness can be accurately measured by profilometry. Metal type can be selected as desired (Au, Ag or Cu).
5) A high Q microstrip circuit completes the fixed resonator part of the circuit.
6) The f-e capacitor is directly fabricated in the resonator. There is no added loss due to soldering, bonding, etc. The transition from resonator to f-e capacitor is uniform, or it can be tapered, if desired.
7) No via holes are needed if large area ground planes and a Wiltron test fixture (with jaws to hold and ground the circuit top and bottom) is used. Drilling vias in hard substrates is a significant cost adder and reduces the number of such test circuits that can be fabricated.
8) This circuit can be accurately modeled in EM software.
9) This circuit can be fabricated without f-e film to determine a base loss (at a higher $f_0$, of course) of the circuit for correlation to simulations.
10) The use of a low loss substrate minimizes its effect on the overall circuit.
11) Measured results of $f_0$ and $I.L._{0,}$ can be used to extract f-e film dielectric constant and tan $\delta$.
12) The circuit in FIG. 7 can be fabricated with an aperture in the base substrate where the f-e cap is shown. Now, independent f-e caps can be placed over the aperture, held in place with pressure, allowing the f-e caps to be tested as stand-alone components.

Figure 8A:
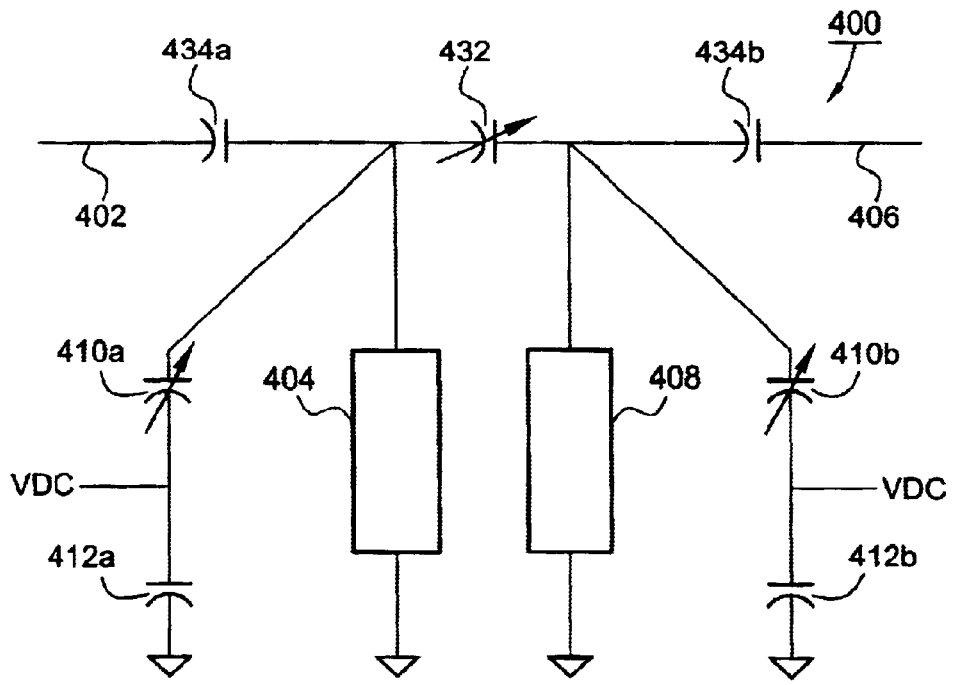
FIG. 8a is a schematic of a double pole tunable filter having a ferro-electric capacitor configured to compensate for frequency response distortions induced by tuning.

Referring now to FIG. 8a, a two stage TCC tunable BPF 400 is illustrated. As discussed with respect to FIG. 5, each stage of bandpass filter 400 comprises a resonator 404 and 408 and f-e capacitor 410a and 410b. The resonators 404 and 408 are shown as ¼ wavelength short-circuited resonators but may also be ½ wavelength open circuit resonators.

A variable DC voltage applied to the f-e capacitors 410a and 410b tunes the bandpass filter 400. The ferro-electric capacitors 410a and 410b couple to ground through DC blocking capacitors 412a and 412b, since the resonators are shorted in this example.

An RF signal is received at input port 402 and output at output port 406. Note that input port 402 and output port 406 are interchangeable. In addition to input capacitor 434a and output capacitor 434b, which are functionally similar to capacitors 143 and 145 discussed with respect to FIG. 6, an additional capacitor 432 is provided as an impedance and admittance inverter between the resonators 404 and 408 to create the desired BPF response. It will be appreciated that capacitor 432 can also be a discrete element or implemented through aperture coupling between resonators 404 and 408.

Figure 8B:
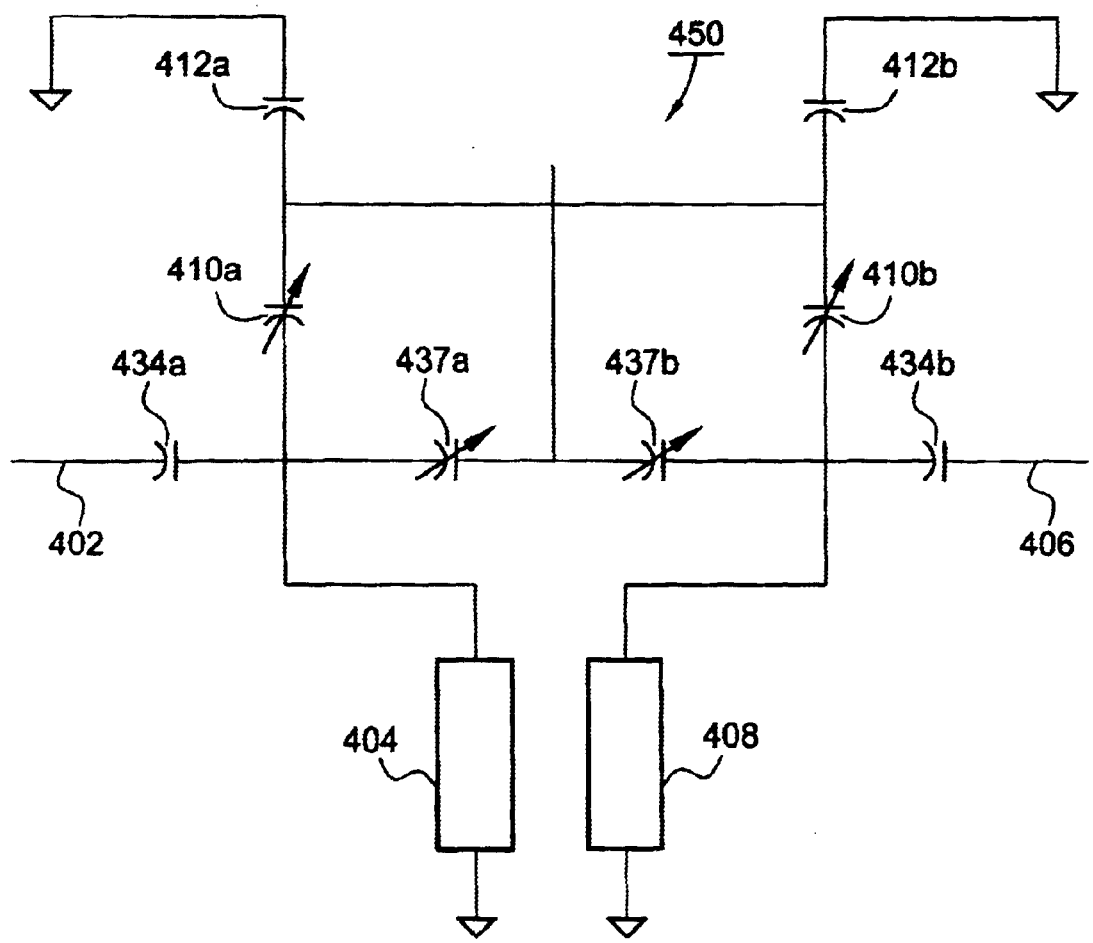
FIG. 8b is a schematic of a double pole tunable filter having a two ferro-electric capacitors configured to compensate for frequency response distortions induced by tuning.

The tunable two-stage filters 400 and 450 illustrated in FIGS. 8a and 8b have a basic topology which creates a high or low side zero that can be used to provide better rejection for a given passband I.L. In the case of inter-resonator coupling along their entire length, the passband I.L. and out-of-band rejection will change as the ferro-electric capacitors tune the bandpass filter across the passband. To minimize any resulting distortion, particularly in the rejection band, capacitor 432 may be a f-e capacitor. Tuning capacitors 413 and 419 makes the zero track in frequency with the tunable passband.

To facilitate the biasing and tuning of f-e capacitor coupling between the resonators 404 and 408, capacitor 432 may be replaced by f-e capacitors 437a and 437b as shown in FIG. 8b. Capacitors 437a and 437b ideally have a capacitance twice that of capacitor 432. In this embodiment, the ferro-electric capacitors 410a, 410b, 437a and 437b may all be tuned using a single DC tuning voltage VDC.

Figure 9:
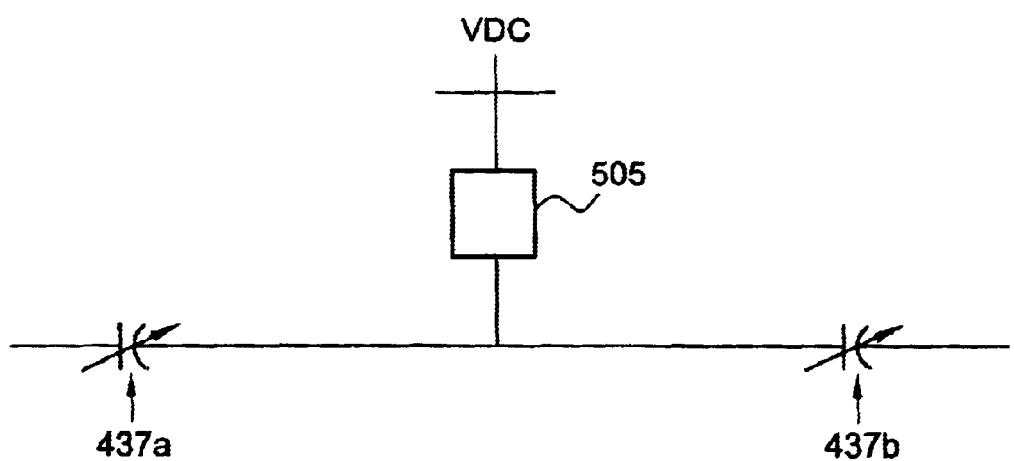
FIG. 9 is a schematic of a divider network and direct current voltage source used to tune the two ferro-electric capacitors configured to compensate for frequency response distortions induced by tuning shown in FIG. 8b.

The single DC tuning voltage for the f-e capacitors may be arranged as shown in FIG. 9. In FIG. 9, $V_{DC}$ is coupled to a divider network 505. The divider network 505 is coupled to both f-e capacitors 437a and 437b. The divider network 505 is configured to provide the appropriate tuning range to the f-e capacitors 437a and 437b so as to cause the zero to track with the passband, as described above.

The divider network 505 may be constructed as shown in FIG. 10. In FIG. 10, $V_{DC}$ is coupled to $R_1$. $R_1$ is coupled to $R_2$ and to both capacitors 437a and 437b. $R_2$ is also coupled to ground. $R_1$ and $R_2$ are chosen to cause the zero to track with the passband, as described above.

Alternatively, a separate voltage can be used to tune both capacitors 437a and 437b.

Figure 11A:
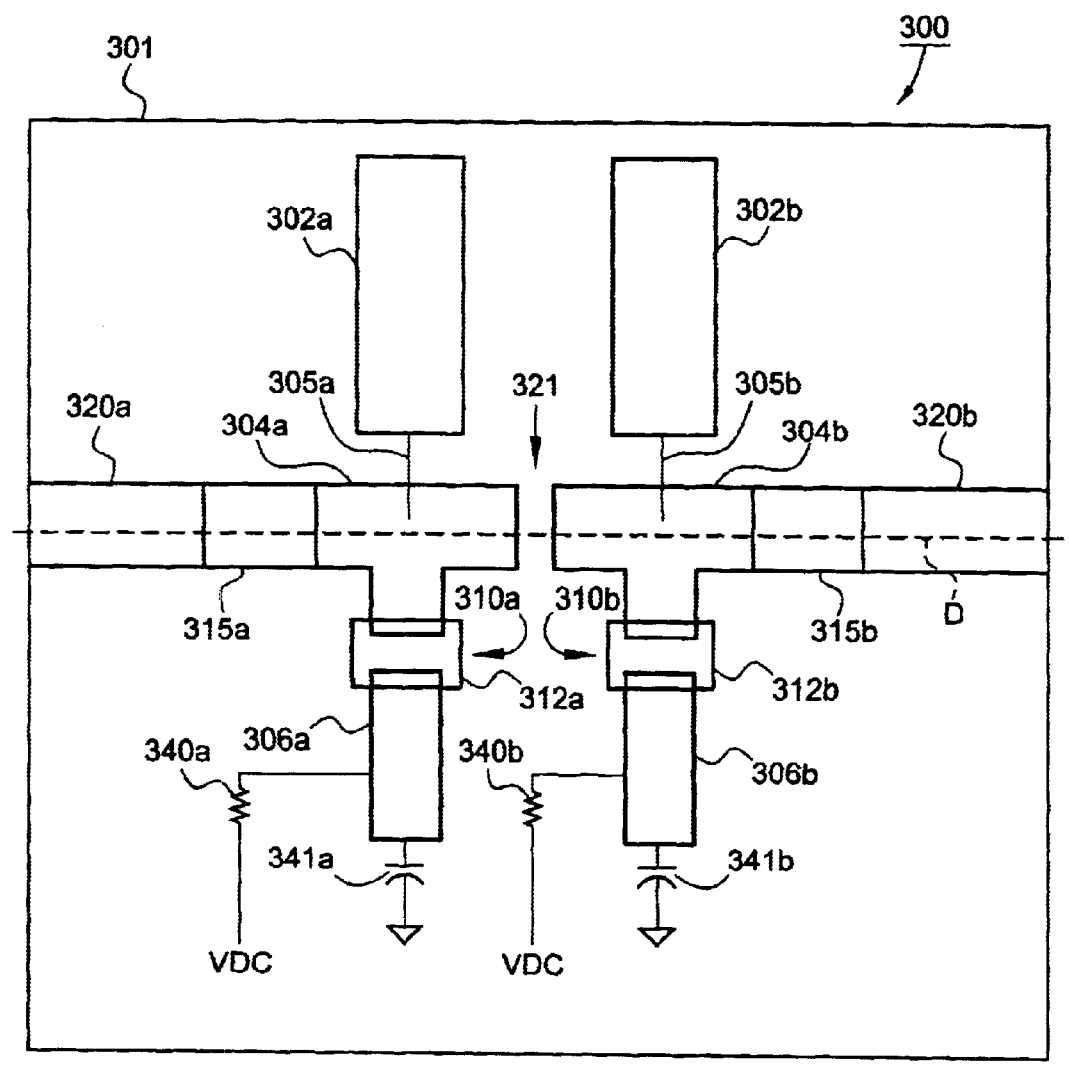

Turning now to FIG. 11a, a tunable two-stage filter 300 using coaxial, monoblock resonators 302a and 302b is illustrated. Note that other resonator types could also be used. The resonators 302a and 302b may be open or short circuited. The resonators 302a and 302b attach to a first surface of a substrate 301. Pads 304a and 304b formed on the first surface of the substrate 301 couple to the resonators 302a and 302b through leads 305a and 305b. Pads 306a and 306b formed on the first surface of substrate 301 couple to pads 304a and 304b creating the desired gap for the ferroelectric capacitors 310a and 310b. Ferro-electric layers 312a and 312b underlying the pads 304a and 304b and 306a and 306b complete ferro-electric gap capacitors 310a and 310b. Note that the drawings are not to scale. Typically, the gap spacing is increased for clarity.

Figure 11B:
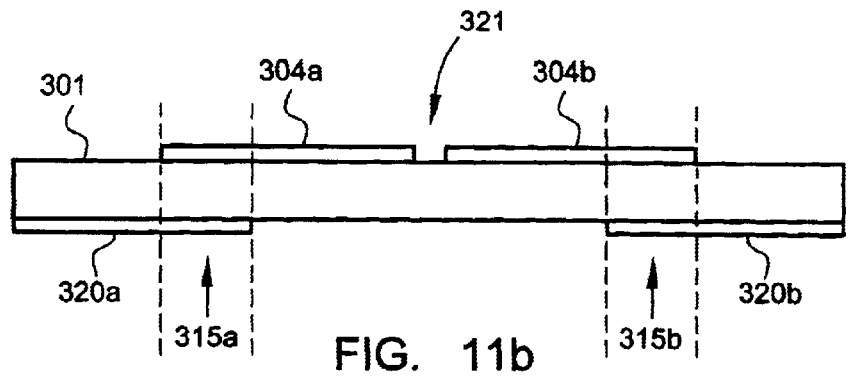
FIG. 11b is a cross-sectional view of the tunable filter shown in FIG. 11a, taken along line D.

There are transmission lines 320a and 320b on a second surface of substrate 301. These transmission lines are used as input and output ports 320a and 320b for signals RF in and RF out. The input and output capacitors 315a and 315b are formed between the transmission lines 320a and 320b and the pads 304a and 304b with substrate 301 in between, as shown in FIG. 11b. FIG. 11b is a cross-sectional view of a portion of filter 300 shown in FIG. 11a. The cross-section is taken along line B.

In addition, capacitor 321 is formed as a gap capacitor by the separation of pads 304a and 304b. Note that the coupling provided by capacitor 321 may alternatively be provided though aperture coupling between coaxial resonators 302a and 302b, eliminating the need for capacitor 321. It will be appreciated that although the coaxial resonators 302a and 302b are shown as separate structures, they may share a common wall to save space and permit any aperture coupling. Additionally, there may be no space and no wall between them. I.e., they may be mutually coupled monoblock resonators. In embodiments in which the coupling provided by capacitor 321 is implemented through aperture coupling, the pads 304a and 304b would be separated by a sufficient distance to minimize any gap capacitance between them. A bias voltage VDC couples through resistors 340a and 340b to tune the ferro-electric capacitors 310a and 310b. Each of the ferro-electric gap capacitors 310a and 310b couple to ground through DC blocking capacitors 341a and 341b.

Figure 12:
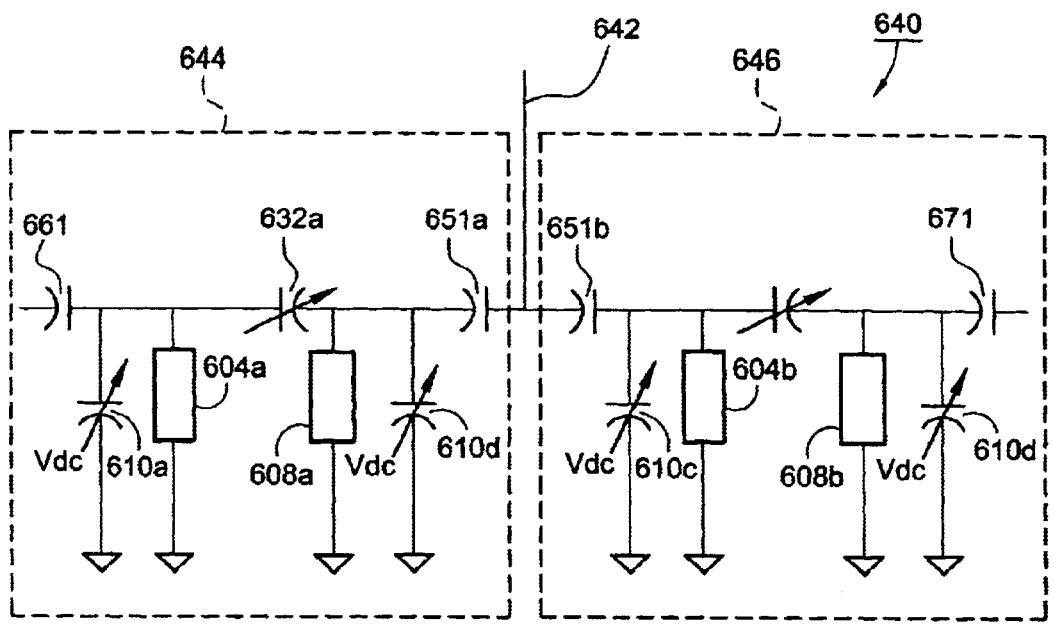
FIG. 12 is a schematic of a tunable duplexer.

The filters 400 and 450 may be adapted to serve as the transmitting and receiving section of a duplexer 640 as shown in FIG. 12. Note that duplexers are a special case of multiplexers. Duplexers are used in conjunction with two bands, while multiplexers are used in conjunction with two or more bands. Alternatively, multiplexers may be defined as for use with more than two bands. Either way, it is to be understood that the present invention can be used in multiplexers generally, even though the discussion is in terms of duplexers, for simplicity.

The duplexer 640 couples to an antenna or diplexer through a common port 642. A transmitting section 644 comprises a two-stage tunable filter constructed as discussed with respect to FIGS. 9, 10 and 11. Thus, transmitting stage 644 has resonators 604a and 608a coupled to their ferroelectric capacitors 610a and 610b, respectively. Resonators 604a, 604b, 608a and 608b may be realized as coaxial, stripline or monoblock resonators, to give three examples. The Tx and Rx sections are typically fabricated with the same topology, for example, monoblock. However, one could use different topologies for Tx and Rx sections if desired. For example, the Tx section could be stripline while the Rx section could be monoblock, depending on requirements, or choice.

If realized as monoblock resonators, they may be EM coupled along their entire length. This EM coupling, along with the coupling provided by capacitor 632a, can be used to create a high side rejection zero located in the Rx band. Ideally, the zero is located in that portion of the Rx band that contains the Rx channel that is paired with the Tx channel in PCS CDMA. This topology provides minimum Tx band I.L.$_0$ along with mazimum Rx band rejection.

The DC blocking capacitors and the DC tuning voltage source are not illustrated. Ferro-electric capacitor 632a is illustrated as implemented in FIG. 8a. However, it will be appreciated that it is preferably implemented as two series-coupled f-e capacitors each of capacitance 2C2 as shown in FIG. 8b. The DC return path for capacitors 610a and 610b is through the shorted resonators 604a and 608a.

The receiving section 646 is constructed analogously. The same comments regarding monoblock coupling and Tx band rejection apply here, analogous to those made regarding Rx band rejection for the Tx filter. However, the electrical lengths of the resonators 604b and 608b in receiving section 646 are chosen differently than those in the transmitting section. In this manner, the passbands over which the sections tune are separated while the capacitance values of the f-e tuning capacitors 610c and 610d remain the same as that of capacitors 610a and 610b.

For example, in the full U.S CDMA PCS band, the transmitting (TX) section 644 would have to tune to transmit over a passband from 1850 to 1910 MHz. Similarly, the receiving (RX) section 446 would have to tune to receive over a passband from 1930 to 1990 MHz. It should be noted that while the full US PCS band is described here, the same concepts apply to other wireless bands, including, for example, the cellular band (800 MHz to 1000 MHz), other PCS bands, 3-G CDMA bands, and any partial bands.

The tuning voltage range for the Tx and Rx bands will not be the same in this case, since even though the required tuning range is 60 MHz (in the example of the full U.S. PCS band), the fractional bandwidths for Tx and Rx are slightly different. This is because the Tx band starts at 1850 MHz, while the Rx band begins at 1930 MHz. Thus, separate tuning voltages will be required in the case where equal value f-e capacitors are used.

In another embodiment, resonators 604a and 608a for the Tx band have the same electrical length for as resonators 604b and 608b for the Rx band. In this case, the capacitance values of the f-e capacitors used to tune the Tx and Rx bands would be different, providing the necessary frequency separation.

The F-E capacitors 610a–d can be used to tune the individual resonators as well. In conventional fixed bandwidth designs each filter or duplexer requires 100% vendor screening and tuning to meet electrical specifications. The use of electrically tunable f-e capacitors can be exploited for this purpose, to compensate for dielectric constant variations, fabrication tolerances and temperature variations. This tuning comes at the price of added tuning capacitance range and ideally is performed by independent tuning (control) voltages for each resonator. This approach increases the demand placed on the control circuitry that generates the DC control voltages.

In another embodiment, a PCS-configured duplexer may use gap coupling to form the capacitors 651a, 651b, 661 and 671. Capacitors 651a, 651b, 661 and 671 are typically in the range 0.25 to 0.3 PF for the US PCS CDMA band. They transform the impedance of the BPF or duplexer to the correct input and output impedances, which is typically 50 ohms.

Additional impedance matching circuitry may be needed at the common port 642 rather than just using capacitors 651a and 651b, as shown. The system requirements for a specific application will determine what voltage standing wave ratio (VSWR) must be seen looking into port 642 when the Tx and Rx parts are terminated in their correctly specified impedances (typically 50 Ω).

A filter or duplexer (or multplexer) is a frequency selective impedance transforming network. As such, it can be designed to transform impedance levels between its input and output ports to and from values other than the standard 50 ohms. With this in mind, capacitors 661 and 671 may take on a wider range of values, as required. Capacitors must be chosen to give the correct capacitance in any case.

In one embodiment, where the dielectric constant (DK) of the ceramic in the resonators 604a, 604b, 608a and 608b is 38.6. The resonators 604a and 608b in the transmitting section 644 have an electrical length of 232 mils whereas the resonators 604b and 608b in the receiving section 646 have an electrical length of 221 mils. The f-e capacitors 610a–d have a capacitance of 0.66 pF and a Q of 180.

In another embodiment, monoblock filters fabricated with a ceramic DK=38.6 are used, with a height of 4.0 mm, a Zoe=18.95 Ω, Zoo=13.80 Ω, a center conductor diameter of 36.24 mils, and center conductor spacing edge to edge of 64.68 mils.

Figure 13:
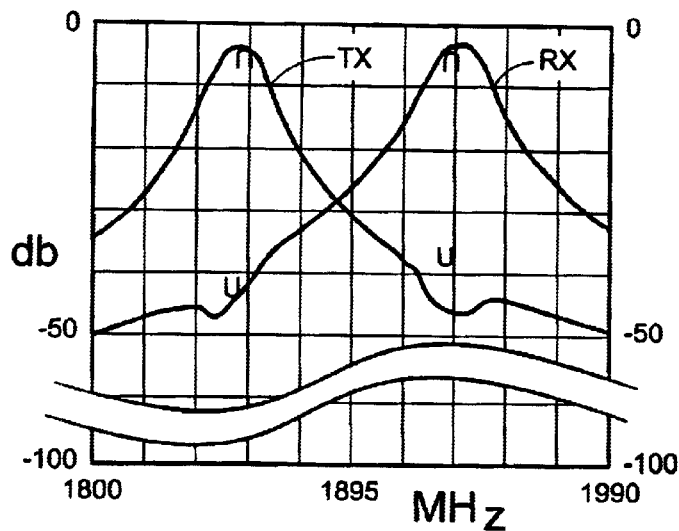
FIG. 13 is a frequency response graph of a tunable duplexer with chip capacitor input and output coupling and f-e capacitor Q=180.
Figure 14:
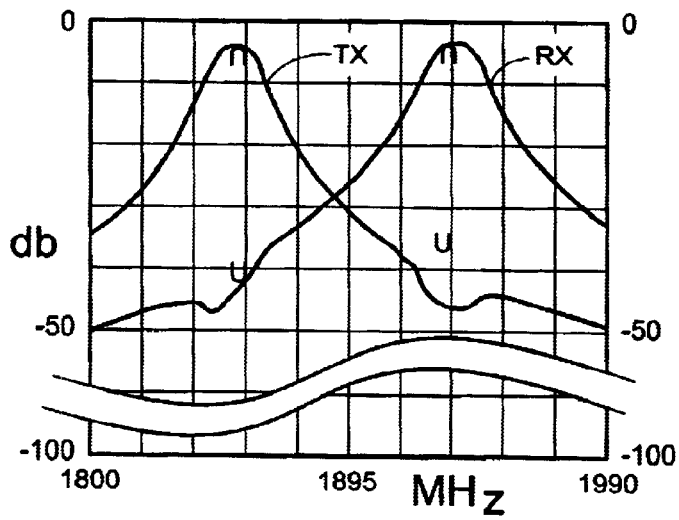
FIG. 14 is a frequency response graph of a tunable duplexer with chip capacitor input and output coupling and f-e capacitor Q=450.

The resulting frequency responses for such PCS-configured sections 644 and 646 are as shown in FIG. 13. FIG. 14 illustrates the resulting frequency responses should the Q of the f-e capacitors 610a–d be increased to 450. The responses in FIGS. 13 and 14 are based on 4.0 mm coaxial resonators with no EM coupling between them.

Figure 15:
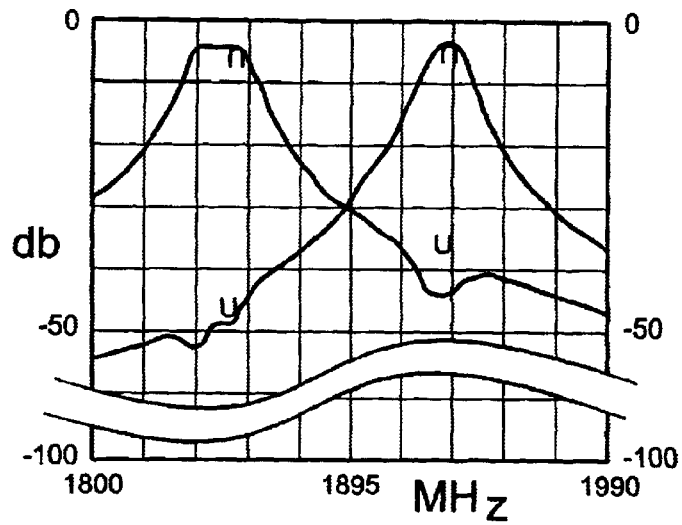
FIG. 15 is a frequency response graph of a tunable duplexer with integrated gap capacitor input and output coupling and f-e capacitor Q=180.
Figure 16:
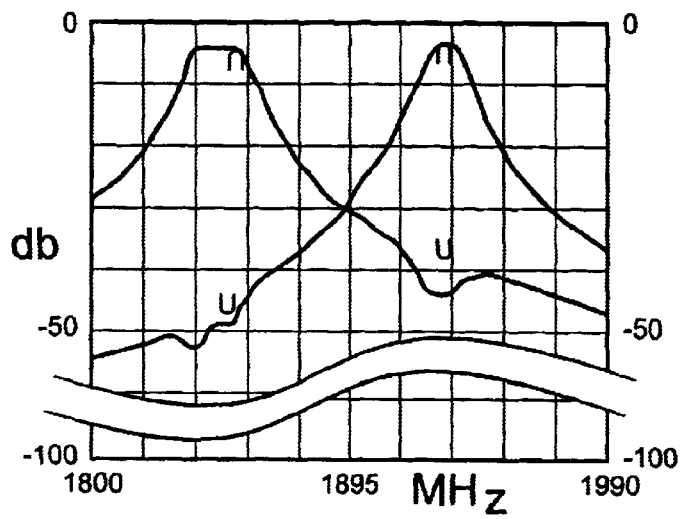
FIG. 16 is a frequency response graph of a tunable duplexer with integrated gap capacitor input and output coupling and f-e capacitor Q=450.

In another embodiment, capacitors 651a, 651b, 661 and 671 may be implemented as discrete overlay capacitors having a quality factor of 250 or greater. In this embodiment, the resonators 604a and 608b in the transmitting section 644 may have an electrical length of 233.179 mils whereas the resonators 604b and 608b in the receiving section 646 may have an electrical length of 222.32 mils. Should the ferroelectric capacitors 610a–d have a capacitance of 0.66 pf and a quality factor of 180, the frequency response for the resulting PCS-configured duplexer is as illustrated in FIG. 15. Similarly, if the quality factor of the ferro-electric capacitors 610a–d is increased to 450, the frequency response is as illustrated in FIG. 16. FIGS. 13–16 are examples of frequency responses of example duplexers.

In any of these embodiments, the Q of the f-e caps can be lower, as long as an increased passband I.L. can be tolerated. If the specification for worst case passband I.L. is −3.5 dB for Tx band, one can use a $C_{f\text{-}e}$=0.66 pF with an associated Q of about 80 at 2.0 GHz and still meet the specification. The f-e capacitors' Q may need to be higher to account for fabrication losses such as $L_{attach}$.

The preferred solution is to obtain the highest f-e capacitor Q possible while meeting the tuning requirements. This will provide the minimum I.L.$_0$ in both Tx and Rx bands. A smaller $C_{f\text{-}e}$ results in less loading of the BPF or duplexer at 1900 MHz. The lower limit on $C_{f\text{-}e}$ is imposed by tuning range. In the embodiment shown in FIGS. 12–16, a minimum delta (Δ) $C_{f\text{-}e}$(of capacitors 410a and 410b of FIG. 8a)=0.25 pF along with a $\Delta C_{f\text{-}e}$(of capacitor 432 of FIG. 8a)=0.033 pF is needed in an EM coupled monoblock design, and $\Delta C_{f\text{-}e}$(of capacitors 410a and 410b of FIG. 8a)=0.34 pF is needed in a non-EM coupled design. A lower passband I.L. is typically preferred particularly in power sensitive applications like handsets, since a lower passband I.L. places less demands on other components, such as power amplifiers. This, in turn, has a positive impact on battery life or talk time.

Using the monoblock design as an example, if a $C_{f\text{-}e}$ tuning range of 2:1 is achievable for a given f-e film, DC tuning voltage and f-e capacitor topology, then $C_{f\text{-}e}$ (0V DC)=0.5 pF would be the minimum $C_{f\text{-}e}$ that would achieve the $\Delta C_{f\text{-}e}$=0.25 pF required. If one wished to start with $C_{f\text{-}e}$ (0V DC)=0.375 pF, one would need a tuning range of 3:1 to achieve the $\Delta C_{f\text{-}e}$=0.25 pF required.

Although the invention has been described with reference to particular embodiments, the description is only an example of the invention's application and should not be taken as a limitation. Consequently, various adaptations and combinations of features of the embodiments disclosed are within the scope of the invention as encompassed by the following claims.

I claim:

1. A tunable multiplexer comprising:
   a first control signal generator for generating a first control signal;
   a first capacitor;
   a first resonator;
   the first capacitor and the first resonator configured as a first electromagnetic signal filter having a first resonant frequency;
   a first ferro-electric material portion positioned proximate the first capacitor for adjusting, responsive to the first control signal, the capacitance of the first capacitor for adjusting the first resonant frequency;
   a second control signal generator for generating a second control signal;
   a second capacitor;
   a second resonator;
   the second capacitor and the second resonator configured as a second electromagnetic signal filter having a second resonant frequency;
   a second ferro-electric material portion positioned proximate the second capacitor for adjusting, responsive to the second control signal, the capacitance of the second capacitor for adjusting the second resonant frequency;
   wherein a quality factor of each capacitor, when operated in a temperature range between about −50 degrees Celsius and 100 degrees Celsius, is greater than about 80.

2. The multiplexer of claim 1, wherein the quality factor of each capacitor is greater than about 180.

3. The multiplexer of claim 1, wherein the quality factor of each capacitor is greater than about 350.

4. The multiplexer of claim 1, wherein the quality factor, when operated in a temperature range between about −50 degrees Celsius and 100 degrees Celsius, is greater than about 80 in a frequency range between 0.25 GHz and 7.0 GHz.

5. The multiplexer of claim 4, wherein the quality factor, when operated in a temperature range between about −50 degrees Celsius and 100 degrees Celsius, is greater than about 80 in a frequency range between about 0.8 GHz and 7.0 GHz.

6. The multiplexer of claim 4, wherein the quality factor, when operated in a temperature range between about −50 degrees Celsius and 100 degrees Celsius, is greater than about 80 in a frequency range between about 0.25 GHz and 2.5 GHz.

7. The multiplexer of claim 6, wherein the quality factor, when operated in a temperature range between about −50 degrees Celsius and 100 degrees Celsius, is greater than about 80 in a frequency range between about 0.8 GHz and 2.5 GHz.

8. The multiplexer of claim 1, wherein the quality factor, when operated in a temperature range between about −50 degrees Celsius and 100 degrees Celsius, is greater than about 180 in a frequency range between 0.25 GHz and 7.0 GHz.

9. The multiplexer of claim 8, wherein the quality factor, when operated in a temperature range between about −50 degrees Celsius and 100 degrees Celsius, is greater than about 180 in a frequency range between about 0.8 GHz and 2.5 GHz.

10. The multiplexer of claim 1, wherein the quality factor, when operated in a temperature range between about −50 degrees Celsius and 100 degrees Celsius, is greater than about 80 for a capacitance in a range between about 0.3 pF and 3.0 pF.

11. The multiplexer of claim 10, wherein the quality factor, when operated in a temperature range between about −50 degrees Celsius and 100 degrees Celsius, is greater than about 80 for a capacitance in a range between about 0.5 pF and 1.0 pF.

12. The multiplexer of claim 1, wherein the quality factor, when operated in a temperature range between about −50 degrees Celsius and 100 degrees Celsius, is greater than about 180 for a capacitance in a range between about 0.3 pF and 3.0 pF.

13. The multiplexer of claim 12, wherein the quality factor, when operated in a temperature range between about −50 degrees Celsius and 100 degrees Celsius, is greater than about 180 for a capacitance in a range between about 0.5 pF and 1.0 pF.

14. The multiplexer of claim 1, wherein: the first resonant frequency is between a range of about 1850 MHz to about 1910 MHz; and the second resonant frequency is between a range of about 1930 MHz to about 1990 MHz.

15. The multiplexer of claim 1, wherein:
the first resonant frequency is between a range of about 1750 MHz to about 1780 MHz; and
the second resonant frequency is between a range of about 1840 MHz and about 1870 MHz.

16. The multiplexer of claim 1, further comprising:
a third control signal generator for generating a third control signal;
a third capacitor;
a third resonator;
the third capacitor and the third resonator configured as a third electromagnetic signal filter configured to resonate at a third resonant frequency, wherein the third resonant frequency is approximately equal to the first resonant frequency;
a third ferro-electric material portion positioned proximate the third capacitor for adjusting, responsive to the third control signal, the capacitance of the third capacitor for adjusting the third resonant frequency;
a fourth control signal generator for generating a fourth control signal;
a fourth capacitor;
a fourth resonator;
the fourth capacitor and the fourth resonator configured as a fourth electromagnetic signal filter having a fourth resonant frequency, wherein the fourth resonant frequency is approximately equal to the second resonant frequency;
a fourth ferro-electric material portion positioned proximate the fourth capacitor for adjusting, responsive to the fourth control signal, the capacitance of the fourth capacitor for adjusting the fourth resonant frequency.

17. A tunable multiplexer comprising:
a first control signal generator for generating a first control signal;
a first capacitor;
a first volumetric resonator;
the first capacitor and the first resonator configured as a first electromagnetic signal filter having a first resonant frequency;
a first ferro-electric material portion positioned proximate the first capacitor for adjusting, responsive to the first control signal, the capacitance of the first capacitor for adjusting the first resonant frequency;
a second control signal generator for generating a second control signal;
a second capacitor;
a second volumetric resonator;
the second capacitor and the second resonator configured as a second electromagnetic signal filter having a second resonant frequency;
a second ferro-electric material portion positioned proximate the second capacitor for adjusting, responsive to the second control signal, the capacitance of the second capacitor for adjusting the second resonant frequency.

18. The multiplexer of claim 17, wherein:
the first resonant frequency is between a range of about 1850 MHz to about 1910 MHz; and
the second resonant frequency is between a range of about 1930 MHz to about 1990 MHz.

19. The multiplexer of claim 17, wherein each resonator comprises a stripline resonator.

20. The multiplexer of claim 17, wherein each resonator comprises a monoblock resonator.

21. The multiplexer of claim 17, wherein each resonator comprises a coaxial dielectric loaded resonator.

22. The multiplexer of claim 17, wherein a quality factor of each capacitor is greater than about 80.

23. The multiplexer of claim 17, wherein a quality factor of each capacitor is greater than about 180.

24. The multiplexer of claim 17, wherein a quality factor of each capacitor is greater than about 350.

25. The multiplexer of claim 17, wherein:
the first resonant frequency is between a range of about 1850 MHz to about 1910 MHz; and
the second resonant frequency is between a range of about 1930 MHz to about 1990 MHz.

26. The multiplexer of claim 17, wherein:
the first resonant frequency is between a range of about 1850 MHz to about 1910 MHz; and
the second resonant frequency is between a range of about 1930 MHz to about 1990 MHz.

27. The multiplexer of claim 17, wherein:
the first resonant frequency is between a range of about 1750 MHz to about 1780 MHz; and
the second resonant frequency is between a range of about 1840 MHz and about 1870 MHz.

28. The multiplexer of claim 17, further comprising: a third control signal generator for generating a third control signal; a third capacitor; a third ferro-electric material portion positioned proximate the third capacitor for adjusting, responsive to the third control signal, the capacitance of the third capacitor for adjusting a first frequency response of the multiplexer; a fourth control signal generator for generating a fourth control signal; a fourth capacitor; and a fourth ferro-electric material portion positioned proximate the fourth capacitor for adjusting, responsive to the fourth control signal, the capacitance of the fourth capacitor for adjusting a second frequency response of the multiplexer.

29. A wireless communication device having a battery, a transceiver portion, a user interface, and a housing encasing the battery and the transceiver and adapted to present the user interface external to the housing, the device comprising:
  a first control signal generator for generating a first control signal;
  a first capacitor;
  a first resonator;
    the first capacitor and the first resonator configured as a first electromagnetic signal filter having a first resonant frequency;
  a first ferro-electric material portion positioned proximate the first capacitor of adjusting, responsive to the first control signal, the capacitance of the first capacitor for adjusting the first resonant frequency;
  a second control signal generator for generating a second control signal;
  a second capacitor;
  a second resonator; and
    the second capacitor and the second resonator configured as a second electromagnetic signal filter having a second resonant frequency;
  a second ferro-electric material portion positioned proximate the second capacitor of adjusting, responsive to the second control signal, the capacitance of the second capacitor for adjusting the second resonant frequency.

30. The wireless communication device of claim 29, further comprising:
  a volumetric resonator.

31. The wireless communication device of claim 30, further comprising:
  a stripline resonator.

32. The wireless communication device of claim 30, further comprising:
  a monoblock resonator.

33. The wireless communication device of claim 32, further comprising:
  a coaxial dielectric loaded resonator.

34. The wireless communication device of claim 29, wherein a quality factor of each capacitor is greater than about 80.

35. The wireless communication device of claim 29, wherein a quality factor of each capacitor is greater than about 180.

36. The wireless communication device of claim 29, wherein a quality factor of each capacitor is greater than about 350.

37. The wireless communication device of claim 29, wherein:
  the first resonant frequency is between a range of about 1850 MHz to about 1910 MHz; and
  the second resonant frequency is between a range of about 1930 MHz to about 1990 MHz.

38. The wireless communication device of claim 29, wherein:
  the first resonant frequency is between a range of about 1750 MHz to about 1780 MHz; and
  the second resonant frequency is between a range of about 1840 MHz and about 1870 MHz.

39. The wireless communication device of claim 29, further comprising:
  a third control signal generator for generating a third control signal;
  a third capacitor;
  a third resonator;
    the third capacitor and the third resonator configured as a third electromagnetic signal filter configured to resonate at a third resonant frequency, wherein the third resonant frequency is approximately equal to the first resonant frequency;
  a third ferro-electric material portion positioned proximate the third capacitor for adjusting, responsive to the third control signal, the capacitance of the third capacitor for adjusting the third resonant frequency;
  a fourth control signal generator for generating a fourth control signal;
  a fourth capacitor;
  a fourth resonator;
    the fourth capacitor and the fourth resonator configured as a fourth electromagnetic signal filter having a fourth resonant frequency, wherein the fourth resonant frequency is approximately equal to the second resonant frequency;
  a fourth ferro-electric material portion positioned proximate the fourth capacitor for adjusting, responsive to the fourth control signal, the capacitance of the fourth capacitor for adjusting the fourth resonant frequency.

* * * * *

UNITED STATES PATENT AND TRADEMARK OFFICE
CERTIFICATE OF CORRECTION

| | | |
|---|---|---|
| PATENT NO. | : 6,639,491 B2 | |
| APPLICATION NO. | : 09/912753 | |
| DATED | : October 28, 2003 | |
| INVENTOR(S) | : Toncich | |

It is certified that error appears in the above-identified patent and that said Letters Patent is hereby corrected as shown below:

On Title page (item 73) Please insert --Kyocera Wireless Corp--

Signed and Sealed this

Thirtieth Day of January, 2007

JON W. DUDAS
*Director of the United States Patent and Trademark Office*